(12) United States Patent
Fukushima et al.

(10) Patent No.: US 10,320,292 B2
(45) Date of Patent: Jun. 11, 2019

(54) PHASE COMPENSATION CIRCUIT AND DC/DC CONVERTER USING THE SAME

(71) Applicant: Rohm Co., Ltd., Kyoto (JP)

(72) Inventors: Shun Fukushima, Kyoto (JP); Shingo Hashiguchi, Kyoto (JP); Tetsuo Tateishi, Kyoto (JP)

(73) Assignee: Rohm Co., Ltd., Kyoto (JP)

(*) Notice: Subject to any disclaimer, the term of this patent is extended or adjusted under 35 U.S.C. 154(b) by 0 days.

(21) Appl. No.: 15/849,138

(22) Filed: Dec. 20, 2017

(65) Prior Publication Data

US 2018/0183338 A1 Jun. 28, 2018

(30) Foreign Application Priority Data

Dec. 27, 2016 (JP) .................................. 2016-253301
Dec. 27, 2016 (JP) .................................. 2016-253303

(51) Int. Cl.

| | |
|---|---|
| *H02M 3/156* | (2006.01) |
| *H02M 3/158* | (2006.01) |
| *G05F 1/575* | (2006.01) |
| *H03K 7/08* | (2006.01) |
| *H02M 1/00* | (2006.01) |

(52) U.S. Cl.
CPC ............ *H02M 3/156* (2013.01); *G05F 1/575* (2013.01); *H02M 3/1588* (2013.01); *H03K 7/08* (2013.01); *H02M 2001/0032* (2013.01); *Y02B 70/1466* (2013.01); *Y02B 70/16* (2013.01)

(58) Field of Classification Search
CPC . H02M 2001/0025; H02M 2001/0032; H02M 1/36; H02M 1/44; H02M 3/155; H02M 3/156; H02M 3/1588
See application file for complete search history.

(56) References Cited

U.S. PATENT DOCUMENTS

| | | | |
|---|---|---|---|
| 9,331,573 B2* | 5/2016 | Yanagida | H02M 3/1563 |
| 2009/0058388 A1 | 3/2009 | Kanakubo | |
| 2011/0018507 A1* | 1/2011 | McCloy-Stevens | H02M 3/1588 323/271 |
| 2014/0002043 A1* | 1/2014 | Li | H02M 3/156 323/282 |
| 2014/0145693 A1* | 5/2014 | Lee | H02M 1/00 323/271 |
| 2016/0187914 A1* | 6/2016 | Li | H02M 1/14 323/313 |
| 2016/0370816 A1* | 12/2016 | Wei | G05F 1/56 |
| 2017/0019030 A1* | 1/2017 | Sugawara | H02M 1/4225 |

(Continued)

FOREIGN PATENT DOCUMENTS

JP 2008-061433 3/2008

*Primary Examiner* — Fred E Finch, III
(74) *Attorney, Agent, or Firm* — Fish & Richardson P.C.

(57) ABSTRACT

A phase compensation circuit, being for compensating phase of a first voltage inputted to a PWM comparator of a DC/DC converter having a sleep mode, includes: a phase compensation resistor part including a resistor; a phase compensation capacitor part including a plurality of capacitors; and a switch group arranged to change over the capacitors, in the sleep mode, to a first connection state in which at least one of the capacitors is charged with a first bias voltage and to change over the capacitors, at cancellation of the sleep mode, to a second connection state in which the first voltage is set to a desired initial value.

23 Claims, 17 Drawing Sheets

(56) References Cited

U.S. PATENT DOCUMENTS

2017/0250606 A1* 8/2017 Kawano ................. H02M 1/08
2018/0109186 A1* 4/2018 Zhang ................. H02M 3/158

* cited by examiner

PHASE COMPENSATION CIRCUIT AND DC/DC CONVERTER USING THE SAME

CROSS-REFERENCE TO RELATED APPLICATIONS

This nonprovisional application claims priority under 35 U.S.C. § 119(a) on Patent Applications No. 2016-253301 and No. 2016-253303 both filed in Japan on Dec. 27, 2016, the entire contents of which are hereby incorporated by reference.

BACKGROUND OF THE INVENTION

1. Field of the Invention

The invention disclosed herein relates to a phase compensation circuit and a DC/DC converter using the phase compensation circuit.

2. Description of Related Art

Conventionally, as a power means for various applications, there have been used DC/DC converters (so-called switching power supplies) arranged to generate a desired output voltage from an input voltage by turning on and off an output transistor.

As an example of prior arts related to the above technique, JP 2008-61433 A may be mentioned.

FIG. 15 is a circuit diagram showing a first prior-art example of the DC/DC converter. The DC/DC converter X1 of this prior-art example has a function of, with both an output transistor X11 and a synchronous rectifier transistor X12 turned off in a light-load state (XSLP=L), halting an error amplifier X30, an oscillator X50, a PWM comparator X60, and the like to thereby implement a shifting sleep mode of small power consumption.

Meanwhile, an on-duty Don (i.e., ratio of on-state time Ton of the output transistor X11 occupying in a specified period T) of the DC/DC converter X1 depends on a comparison result between a first voltage VC and a second voltage RAMP both of which are inputted respectively to the PWM comparator X60. Therefore, in the case where the error amplifier X30 that generates the first voltage VC is halted upon a shift to the sleep mode, the on-duty Don of the DC/DC converter X1 becomes unstable, at cancellation of the sleep mode, during a time period until completion of a start-up of the error amplifier X30.

Under such circumstances, the DC/DC converter X1 of this prior-art example has a bias part X80 which holds the first voltage fixed at a proper bias value (equivalent to an initial value of the first voltage VC at the sleep-mode cancellation) during a halt period of the error amplifier X30 in the sleep mode.

However, with the DC/DC converter X1 of this prior-art example, the bias part X80 consumes electric power even in the sleep mode. Thus, there has been room for further improvement in terms of reduction in power consumption.

FIG. 16 is a circuit diagram showing a second prior-art example of the DC/DC converter. The DC/DC converter Y1 of this prior-art example is a step-down type switching power supply of the current mode control method, having a function (so-called OCP (Over Current Protection) function) of restricting coil current IL of a switch output stage Y10 to an upper-limit current value ILMT or less by using a clamper Y110.

FIG. 17 is a COMP versus IL characteristic chart for explaining the OCP function by the clamper Y110. The horizontal axis represents error voltage COMP generated by an error amplifier Y30, and the vertical axis represents average value IL (ave) of the coil current IL.

The clamper Y110 restricts the error voltage COMP to an upper-limit voltage value VLMT or less. As a result, a differential amplifier Y80 is subject to such output feedback control that current sense voltage CSNS responsive to the coil current IL is restricted to the upper-limit voltage value VLMT or less. Thus, the coil current IL is restricted to the upper-limit current value ILMT or less.

In order to suppress a rush current (i.e., excessive coil current IL) arising upon short-circuit emergency of the switch output stage Y10, it is necessary to abruptly change the on-duty Don of the DC/DC converter Y1 (and resultantly the first voltage VC inputted from the differential amplifier Y80 to a PWM comparator Y60 as well) with follow-up after an abrupt change of an output voltage Vo or an input voltage Vi. To meet this demand, it is conceivable to enhance response speed of the differential amplifier Y80 or the clamper Y110 by increasing their drive currents, as an example.

However, there has been a problem that improvidently enhancing the response speed of the the differential amplifier Y80 or the clamper Y110 would cause the voltage loop characteristic to be changed, leading to an increase in oscillation risk.

SUMMARY OF THE INVENTION

In view of the above described problems found by the present inventors, the invention disclosed herein has an objective of providing a phase compensation circuit, as well as a DC/DC converter using the same, capable of implementing reduction of power consumption or suppression of rush currents in the DC/DC converter.

For example, a phase compensation circuit disclosed herein, being for compensating phase of a first voltage inputted to a PWM comparator of a DC/DC converter having a sleep mode, includes: a phase compensation resistor part including a resistor; a phase compensation capacitor part including a plurality of capacitors; and a switch group arranged to change over the capacitors, in the sleep mode, to a first connection state in which at least one of the capacitors is charged with a first bias voltage and to change over the capacitors, at cancellation of the sleep mode, to a second connection state in which the first voltage is set to a desired initial value.

As another example, a phase compensation circuit disclosed herein, being for compensating phase of a first voltage inputted to a PWM comparator of a DC/DC converter adopting current mode control method, includes a phase compensation resistor part and a phase compensation capacitor part, wherein one of the phase compensation resistor part and the phase compensation capacitor part includes plurality of resistors or a plurality of capacitors, and an output voltage or an input voltage of the DC/DC converter is applied as a monitoring-target voltage to a grounding-side node of at least one of the plurality of resistors or the plurality of capacitors.

Other features, elements, steps, advantages, and characteristics of the present invention will become more apparent by the following detailed description of the best mode as well as accompanying drawings associated therewith.

DETAILED DESCRIPTION OF PREFERRED EMBODIMENTS

<First Embodiment>

Figure 1:
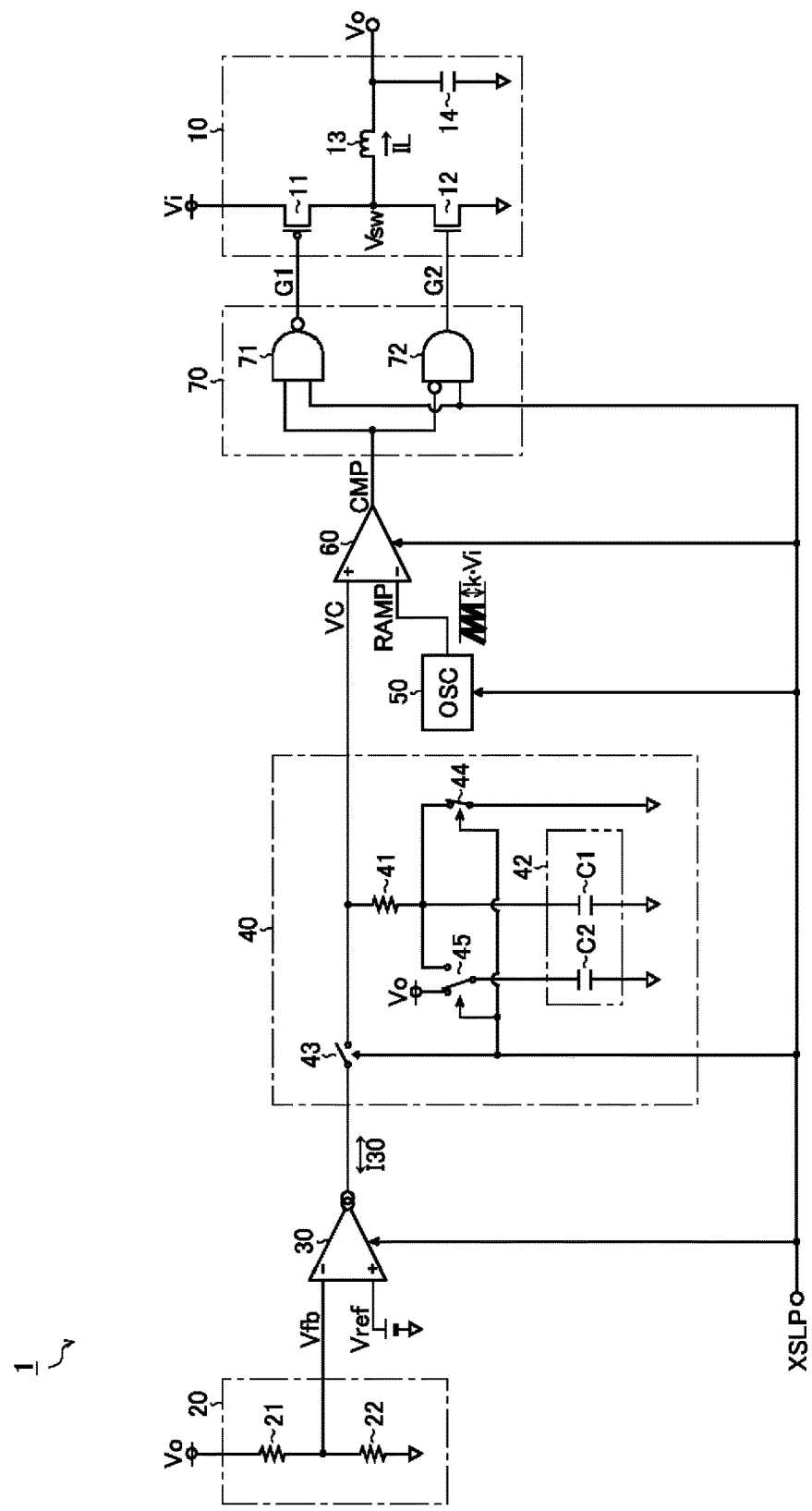
FIG. 1 is circuit diagram showing a first embodiment of the DC/DC converter.

FIG. 1 is circuit diagram showing a first embodiment of the DC/DC converter. The DC/DC converter 1 of this embodiment is a step-down type switching power supply of the PWM (Pulse Width Modulation) drive method which generates an output voltage Vo from an input voltage Vi to supply an unshown load (CPU (Central Processing Unit) or the like) with the voltage. The DC/DC converter 1 includes a switch output stage 10, a feedback voltage generator 20, an error amplifier 30, a phase compensation circuit 40, an oscillator 50, a PWM comparator 60, and a driver 70.

In addition to the above-described circuit elements, other protection circuits (reduced voltage protection circuit, overvoltage protection circuit, overcurrent protection circuit, temperature protection circuit, etc.) may be incorporated in the DC/DC converter 1, as required.

The switch output stage 10 is a step-down type one which steps down an input voltage Vi to generate a desired output voltage Vo. The switch output stage 10 includes an output transistor 11 (PMOSFET (P channel type Metal Oxide Semiconductor Field Effect Transistor) in this figure), a synchronous rectifier transistor 12 (NMOSFET (N channel type MOSFET) in this figure), a coil 13, and a capacitor 14.

The source of the output transistor 11 is connected to an application terminal of the input voltage Vi. The drain of the output transistor 11 is connected to a first terminal of the coil 13. The gate of the output transistor 11 is connected to an application terminal of a gate signal G1. The output transistor 11 is turned off with the gate signal G1 at high level, and turned on with the gate signal G1 at low level.

The source of the synchronous rectifier transistor 12 is connected to a ground terminal (i.e., an application terminal of ground voltage GND). The drain of the synchronous rectifier transistor 12 is connected to the first terminal of the coil 13. The gate of the synchronous rectifier transistor 12 is connected to an application terminal of a gate signal G2. The synchronous rectifier transistor 12 is turned off with the gate signal G2 at high level, and turned on with the gate signal G2 at low level.

In addition, in the case where a high voltage is applied to the switch output stage 10, it is appropriate to use high withstand voltage devices such as power MOSFET, IGBT (Insulated Gate Bipolar Transistor) and SiC transistor for the roles of the output transistor 11 and the synchronous rectifier transistor 12.

The output transistor 11 and the synchronous rectifier transistor 12 are turned on/off complementarily in response to the gate signals G1 and G2. By such on/off operations, a rectangular wave-shaped switch voltage Vsw to be pulse driven between the input voltage Vi and the ground voltage GND is generated at the first terminal of the coil 13. It noted that the term 'complementarily' refers to not only cases where on/off states of the output transistor 11 and the synchronous rectifier transistor 12 are fully reversed, but also cases where simultaneous off time (dead time) is provided in both transistors.

The coil 13 and the capacitor 14 constitute an LC filter that rectifies and smooths a switch voltage Vsw to generate an output voltage Vo. As described above, the first terminal of the coil 13 is connected to respective drains of the output transistor 11 and the synchronous rectifier transistor 12 (i.e., to an application terminal of the switch voltage Vsw). A second terminal of the coil and a first terminal of the capacitor 14 are both connected to an application terminal of the output voltage Vo. A second terminal of the capacitor 14 is connected to a ground terminal.

The feedback voltage generator 20 includes resistors 21 and 22 which are connected in series between an application terminal of an output voltage Vo and a ground terminal, so that a feedback voltage Vfb (partial voltage of output voltage Vo) responsive to the output voltage Vo is outputted from a connection node of the two resistors. In addition, on condition that the output voltage Vo falls within an input dynamic range of the error amplifier 30, the output voltage Vo may be inputted directly to the error amplifier 30 with the feedback voltage generator 20 omitted.

The error amplifier 30 is a current-output type transconductance amplifier (so-called gm amplifier), which generates an error current signal I30 responsive to a differential between a feedback voltage Vfb applied to its inverting input terminal (−) and a reference voltage Vref applied to its noninverted input terminal (+). The error current signal I30 flows in a positive direction (i.e., direction leading from the error amplifier 30 toward the phase compensation circuit 40) when the feedback voltage Vfb is lower than the reference voltage Vref, and the error current signal I30 flows in a negative direction (i.e., direction leading from the phase compensation circuit 40 toward the error amplifier 30) when the feedback voltage Vfb is higher than the reference voltage Vref. In addition, the error amplifier 30 is set to operating state with the sleep control signal XSLP at high level (=logical level at sleep-mode cancellation), and the error amplifier 30 is set to halted state with the sleep control signal XSLP at low level (=logical level under sleep mode).

The phase compensation circuit 40 is connected between the error amplifier 30 and the PWM comparator 60, and generates a first voltage VC upon receiving input of the error current signal I30. Configuration and operation of the phase compensation circuit 40 will be described later.

The oscillator 50 generates a second voltage RAMP of a ramp waveform (i.e., triangular waveform, sawtooth waveform, n-th degree slope waveform (e.g., n=2), etc.) which is pulse driven at a specified switching frequency fsw (=1/T). Also, in the oscillator 50, amplitude of the second voltage RAMP is set as a variable value (=k×Vi) responsive to the input voltage Vi. Accordingly, the amplitude of the second voltage RAMP increases more and more with increasing input voltage Vi, and decreases more and more with decreasing input voltage Vi. Technical significance of this behavior will be described later. In addition, like the foregoing error amplifier 30, the oscillator 50 is set to operating state with the sleep control signal XSLP at high level, and set to halted state with the sleep control signal XSLP at low level.

The PWM comparator 60 compares a first voltage VC applied to its noninverting input terminal (+) and a second voltage RAMP applied to its inverting input terminal (−) to each other to generate a comparison signal CMP. The comparison signal CMP goes high level with the first voltage VC higher than the second voltage RAMP, and goes low level with the first voltage VC lower than the second voltage RAMP. In addition, like the error amplifier 30 and the oscillator 50 mentioned above, the PWM comparator 60 is set to operating state with the sleep control signal XSLP at high level, and set to halted state with the sleep control signal XSLP at low level.

The driver 70, including a NAND gate 71 and an AND gate 72, generates gate signals G and G2 (equivalent to drive signals for the switch output stage 10, respectively) in response to the comparison signal CMP. More specifically, the NAND gate 71 outputs, as the gate signal G1, a NAND operation signal of the sleep control signal XSLP and the comparison signal CMP. Also, the AND gate 72 outputs, as the gate signal G2, an AND operation signal of the sleep control signal XSLP and an invertedly-inputted comparison signal CMP.

Accordingly, when the sleep control signal XSLP is at high level, the gate signals G1 and G2 basically each become a logically inverted signal of the comparison signal CMP. More specifically, when the comparison signal CMP is at high level, the gate signals G1 and G2 both go low level, so that the output transistor 11 is turned on while the synchronous rectifier transistor 12 is turned off. Conversely, when the comparison signal CMP is at low level, the gate signals G1 and G2 both go high level, so that the output transistor 11 is turned off while the synchronous rectifier transistor 12 is turned on.

Meanwhile, when the sleep control signal XSLP is at low level, the gate signal G1 goes high level independently of the comparison signal CMP while the gate signal G2 goes low level independently of the comparison signal CMP. Consequently, the output transistor 11 and the synchronous rectifier transistor 12 are both turned off.

Thus, the DC/DC converter 1 of this embodiment has a function of, with the sleep control signal XSLP at low level, turning off both the output transistor 11 and the synchronous rectifier transistor 12 and thereafter halting the error amplifier 30, the oscillator 50, the PWM comparator 60 or the like to make a shift to the sleep mode of small power consumption.

Desirably, the sleep control signal XSLP is turned to low level when a light-load state (or no-load state) has arisen. In addition, a method of detecting the above-described light-load state may be, for example, a technique of detecting a reverse current of the coil current IL (i.e., detecting a zero cross of the switch voltage Vsw).

<Phase Compensation Circuit>

With reference still to FIG. 1, configuration and operation of the phase compensation circuit 40 will be described in detail. The phase compensation circuit 40 of the figure includes a phase compensation resistor part 41, a phase compensation capacitor part 42, and switches 43 to 45 to compensate the phase of the first voltage VC, thereby preventing oscillations of the output feedback loop.

The phase compensation capacitor part 42 includes capacitors C1 and C2. First terminals of the capacitors C1 and C2 are connected to ground terminals, respectively. Given a capacitance value C of the whole phase compensation capacitor part 42, a capacitance value C1 of the capacitor C1, and a capacitance value C2 of the capacitor C2, then it is satisfied that C=C1+C2, C2/C1=k/(1−k) (where 0<k<1). In the phase compensation capacitor part 42 of this embodiment, as can be seen above, two divided capacitors for use of phase compensation are included, the technical significance of which will be described later.

The phase compensation resistor part 41 includes a resistor having a first terminal connected to the noninverting input terminal (+) of the PWM comparator 60 as well as a second terminal connected to the second terminal of the capacitor C1.

The switch 43 makes electrical continuity/discontinuity between the noninverting input terminal (+) of the PWM comparator 60 and the output terminal of the error amplifier 30 in response to the sleep control signal XSLP. More specifically, with the sleep control signal XSLP at high level, the switch 43 is turned on so as to make continuity between the noninverting input terminal (+) of the PWM comparator 60 and the output terminal of the error amplifier 30. With the sleep control signal XSLP at low level, the switch 43 is turned off so as to make discontinuity between the noninverting input terminal (+) of the PWM comparator 60 and the output terminal of the error amplifier 30.

The switch 44 makes electrical continuity/discontinuity between the second terminal of the capacitor C1 and the ground terminal in response to the sleep control signal XSLP. More specifically, with the sleep control signal XSLP at low level, the switch 44 is turned on so as to make continuity between the second terminal of the capacitor C1 and the ground terminal. With the sleep control signal XSLP at high level, the switch 44 is turned off so as to make discontinuity between the second terminal of the capacitor C1 and the ground terminal.

The switch 45 changes over, in response to the sleep control signal XSLP, which the second terminal of the capacitor C2 is connected to an application terminal of an output voltage Vo (equivalent to a first bias voltage) or to the second terminal of the capacitor C1. More specifically, with the sleep control signal XSLP at low level, the switch 45 connects the second terminal of the capacitor C2 to the application terminal of the output voltage Vo. With the sleep control signal XSLP at high level, the switch 45 connects the second terminal of the capacitor C2 to the second terminal of the capacitor C1.

The switches 44 and 45, as described above, change over the connection destination of the capacitors C1 and C2 in response to the sleep control signal XSLP. With this arrangement, these switches 44 and 45 function as a switch group which, in the sleep mode (XSLP=L), changes over the capacitors C1 and C2 to a first connection state so that the capacitor C2 is charged with the output voltage Vo applied thereacross, and which, at the sleep-mode cancellation (XSLP=H), changes over the capacitors C1 and C2 to a second connection state so that the first voltage VC is set to a desired initial value (=k×Vo).

The above-mentioned term of first connection state refer to a state in which the switch 44 makes continuity between the second terminal of the capacitor C1 and the ground terminal while the switch 45 makes the second terminal of the capacitor C2 connected to the application terminal of the output voltage Vo. On the other hand, the term of second connection state refers to a state in which the switch 44 make discontinuity between the second terminal of the capacitor C1 and the ground terminal while the switch 45 makes the second terminal of the capacitor C2 connected to the second terminal of the capacitor C1.

Next, duty-initial-value setting operation at the sleep-mode cancellation in the first embodiment will be described in detail with reference to FIG. 2.

Figure 2:
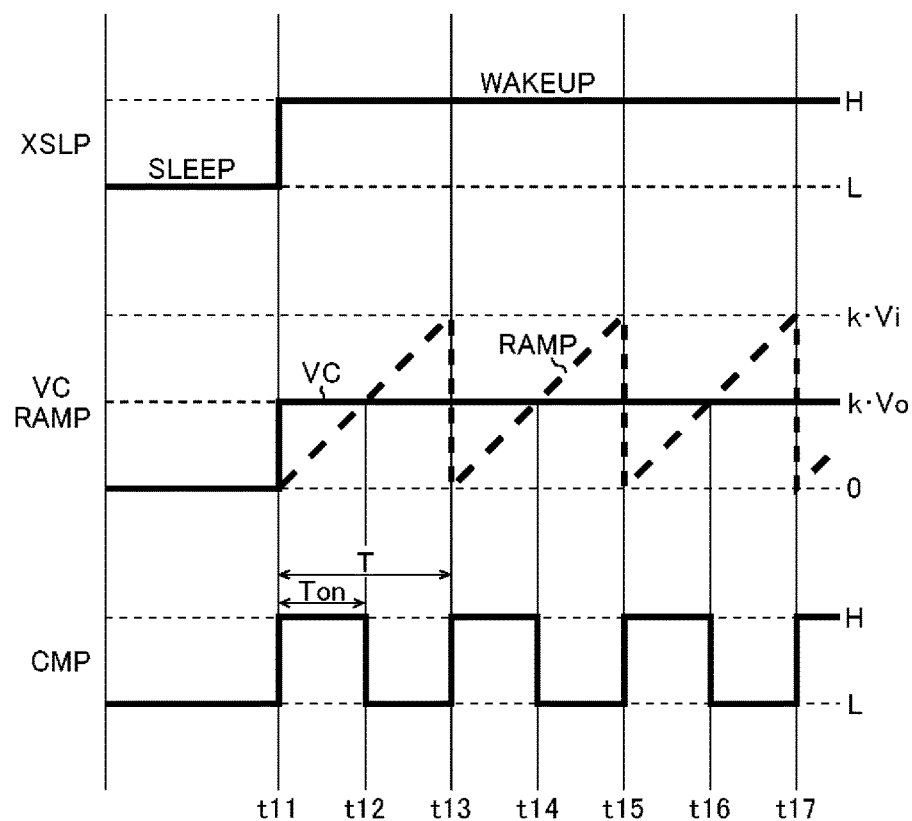
FIG. 2 is a timing chart showing duty-initial-value setting operation in the first embodiment.

FIG. 2 is a timing chart showing an example of the duty-initial-value setting operation in the first embodiment. Charted in the figure, in order from above to below, are the sleep control signal XSLP, the first voltage VC (solid line) plus the second voltage RAMP (broken line), and the comparison signal CMP.

Prior to time t11, the sleep control signal XSLP has been set at low level, and the DC/DC converter 1 has been shifted to the power-saving sleep mode. In this case, in the phase compensation circuit 40, continuity between the noninverting input terminal (+) of the PWM comparator and the output terminal of the error amplifier 30 is interrupted while continuity between the second terminal of the capacitor C1 and the ground terminal is made, resulting in a state in which the second terminal of the capacitor C2 is connected to the application terminal of the output voltage Vo. Accordingly, there arises a discharged state across the capacitor C1 while the capacitor C2 is charged with the output voltage Vo applied thereacross. In the sleep mode, the first voltage VC and the second voltage RAMP both come to 0 V, and the comparison signal CMP comes to low level.

When the sleep control signal XSLP is raised to high level at time t11, the DC/DC converter 1 returns to wakeup mode. In this case, in the phase compensation circuit 40, continuity between the noninverting input terminal (+) of the PWM comparator 60 and the output terminal of the error amplifier 30 is made while continuity between the second terminal of the capacitor C1 and the ground terminal is interrupted, resulting in a state in which the second terminal of the capacitor C2 is connected to the second terminal of the capacitor C1.

That is, as the sleep mode is canceled, the phase compensation capacitor part 42 results in a state in which the capacitor C1 discharged thereacross and the capacitor C2 charged with the output voltage Vo applied thereacross are connected in parallel to each other.

As a consequence, without awaiting the start-up of the error amplifier 30, the first voltage VC is promptly raised up to VC=k×Vo (={C2/(C1+C2)}×Vo) according to the charge partitioning law for correlation between the capacitors C1 and C2.

After time t11 on, the oscillator 50 keeps in the operating state, in which the ramp-waveform second voltage RAMP to be pulse driven at the switching frequency fsw (=1/T) is generated. In addition, as described above, the amplitude of the second voltage RAMP is set as a variable value (=k×Vi) responsive to the input voltage Vi.

In this connection, the on-duty Don (=Ton/T) of the DC/DC converter 1 depends on a comparison result between the first voltage VC and the second voltage RAMP. In more detail, starting at a timing when the first voltage VC (=k×Vo) and the second voltage RAMP (=(k×Vi/T)×Ton) coincides with each other, the on-duty Don (equivalent to duty initial value) at the sleep-mode cancellation comes to Vo/Vi. This duty initial value coincides with a duty theoretical value derived when the input voltage Vi is stepped down to generate a desired output voltage Vo. Accordingly, overshoot and undershoot of the output voltage Vo at the sleep-mode cancellation can be prevented.

Figure 15:
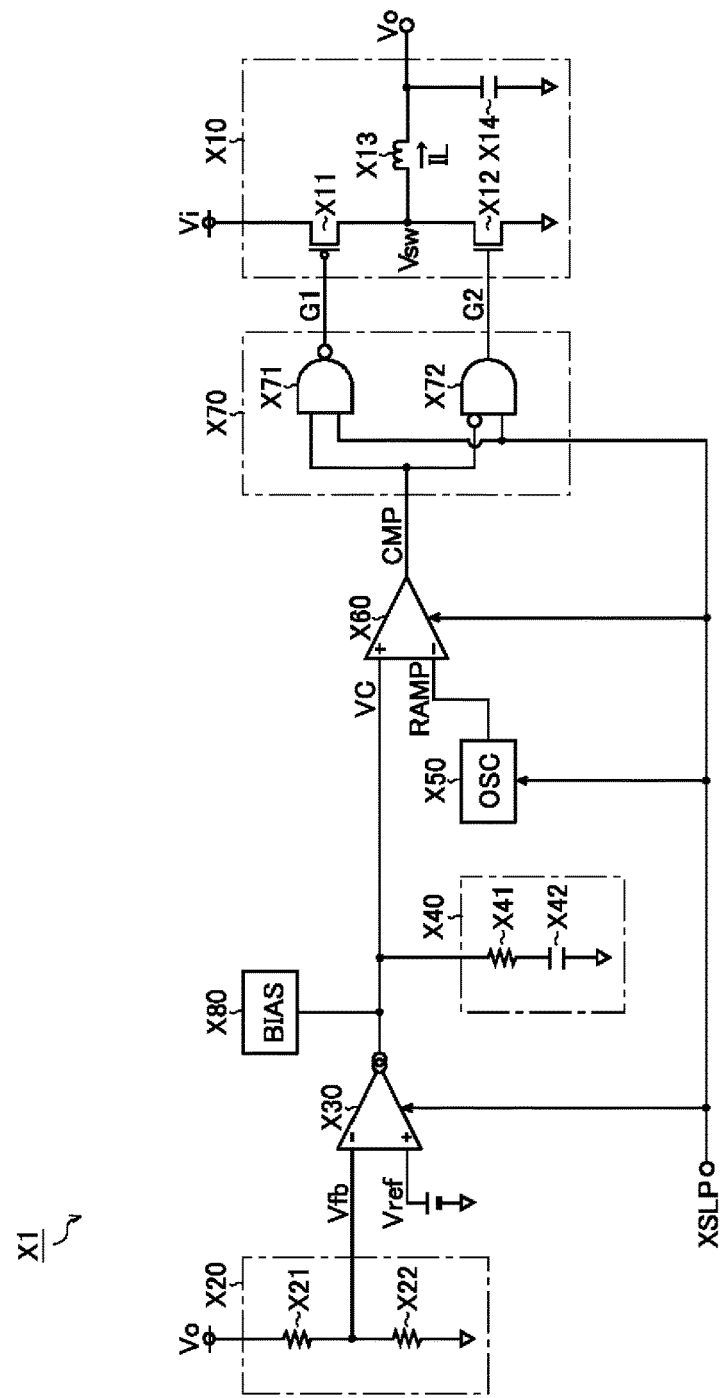
FIG. 15 is a circuit diagram showing a first prior-art example of the DC/DC converter.
Figure 16:
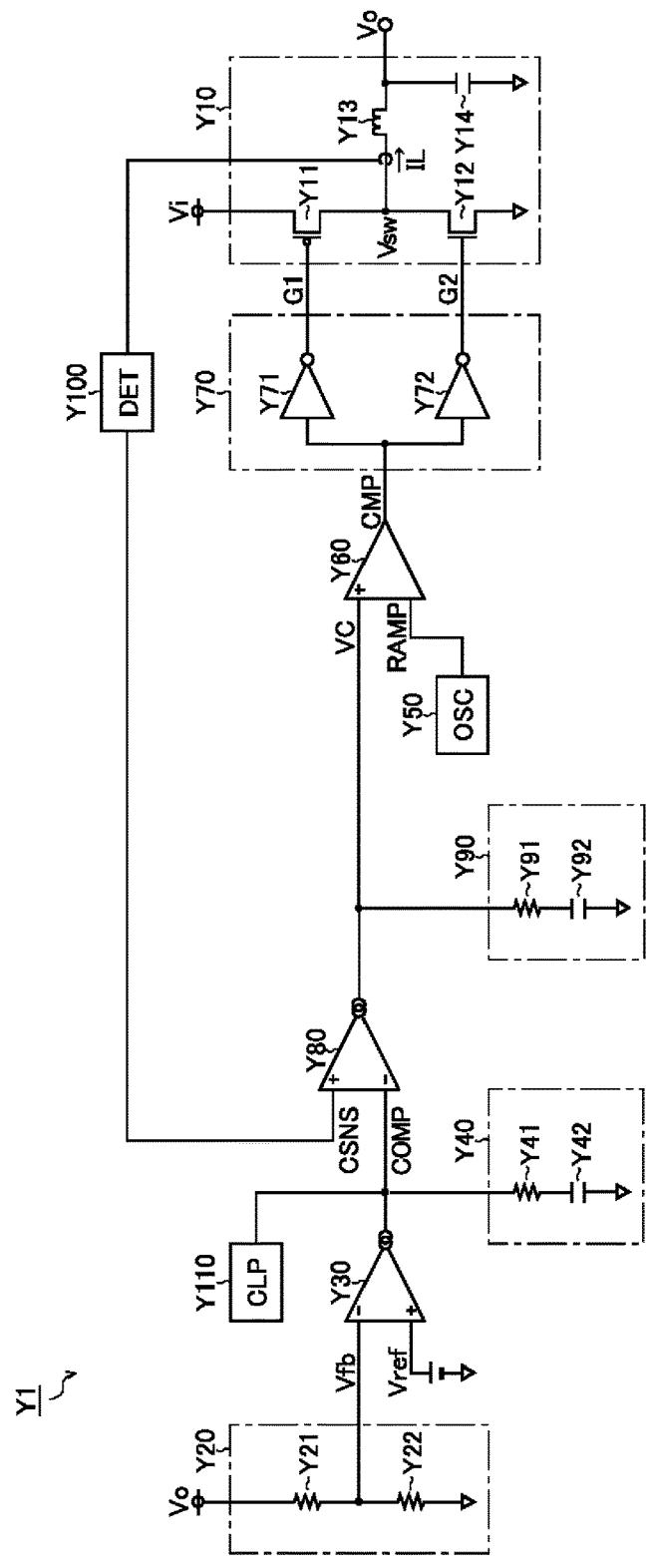
FIG. 16 is a circuit diagram showing a second prior-art example of the DC/DC converter.
Figure 17:
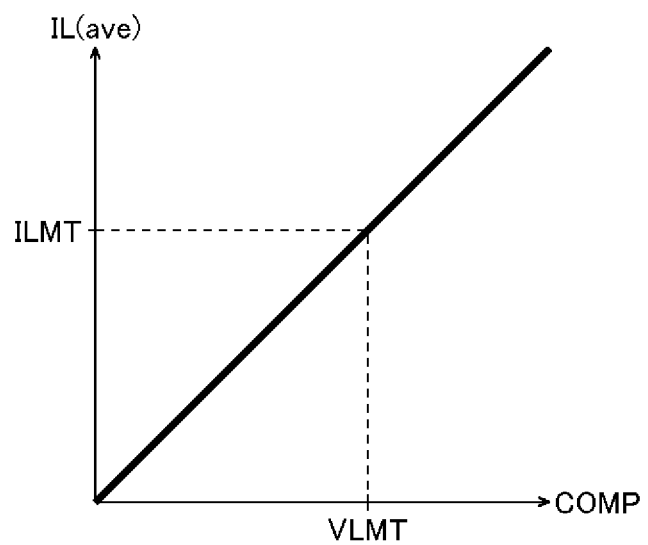
FIG. 17 is a COMP versus IL characteristic chart for explaining the OCP function by the clamper.

Given an arrangement that the duty initial value at the sleep-mode cancellation is set by using the phase compensation circuit 40, there is no need for keeping the bias part X80 under operation in the sleep mode, unlike the DC/DC converter X1 of FIG. 15, so that the power consumption involved can be reduced to a large extent.

Since the capacitor C2 has no current flowing therethrough after completion of its charging, power consumption of the phase compensation circuit 40 in the sleep mode is naught as well.

Further, with the DC/DC converter 1 of this embodiment, since the duty initial value at the sleep-mode cancellation can be set by changing over the switches 43 to 45 of the phase compensation circuit 40, restart time (=recovery time) of the DC/DC converter 1 can be reduced to zero, ideally.

<Second Embodiment>

Figure 3:
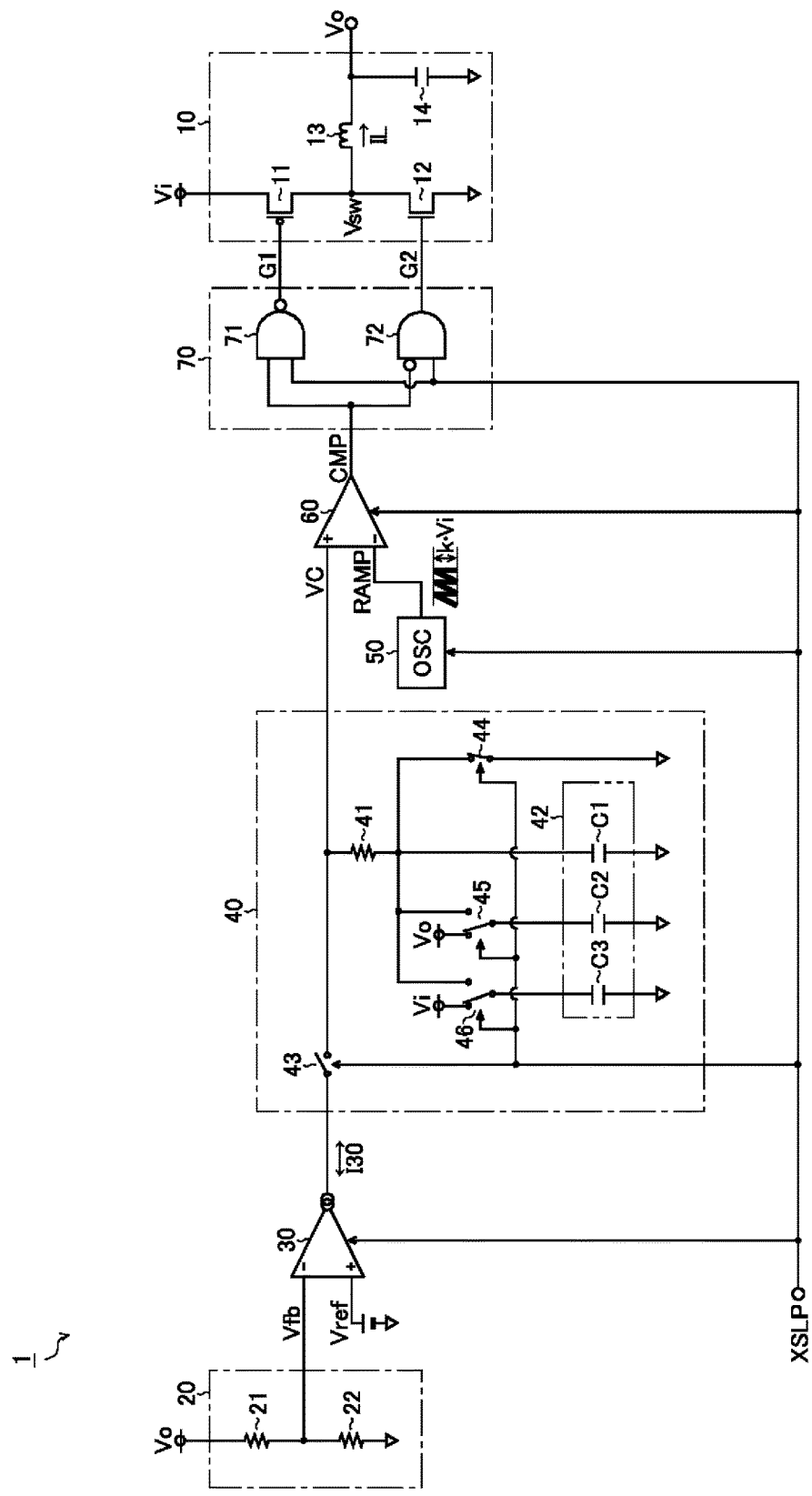
FIG. 3 is a circuit diagram showing a second embodiment of the DC/DC converter.

FIG. 3 is a circuit diagram showing a second embodiment of the DC/DC converter. The DC/DC converter 1 of this embodiment is based on the first embodiment (FIG. 1) and moreover characterized by further including a capacitor C3 and a switch 46 as component elements of the phase compensation circuit 40. Therefore, the same component elements as in the first embodiment are designated by the same reference signs as in FIG. 1 with their repetitive description omitted, and characterizing parts of the second embodiment will be described emphatically below.

The capacitor C3, like the capacitors C1 and C2, is a component element of the phase compensation capacitor part 42, having a first terminal connected to a ground terminal. Given a capacitance value C of the whole phase compensation capacitor part 42, a capacitance value C1 of the capacitor C1, a capacitance value C2 of the capacitor C2, and a capacitance value C3 of the capacitor C3, then it is satisfied that C=C1+C2+C3, C1:C2:C3={1−(k+k')}:k:k' (where 0<k<1 and 0<k'<1). In the phase compensation capacitor part 42 of this embodiment, as can be seen above, three divided capacitors for use of phase compensation are included, the technical significance of which will be described later.

The switch 46, like the switches 44 and 45, is a component element of the switch group that changes over the connection state of the capacitors C1 to C3 in response to the sleep control signal XSLP. With this arrangement, the switch 46 changes over which a second terminal of the capacitor C3 is connected to an application terminal of an input voltage Vi (equivalent to a second bias voltage different from the first bias voltage) or to the second terminal of the capacitor C1. More specifically, the switch 46 makes the second terminal of the capacitor C3 connected to the application terminal of the input voltage Vi with the sleep control signal XSLP at low level, and makes the second terminal of the capacitor C3 connected to the second terminal of the capacitor C1 with the sleep control signal XSLP at high level.

Next, the duty-initial-value setting operation at the sleep-mode cancellation in the second embodiment will be described in detail with reference to FIG. 4.

Figure 4:
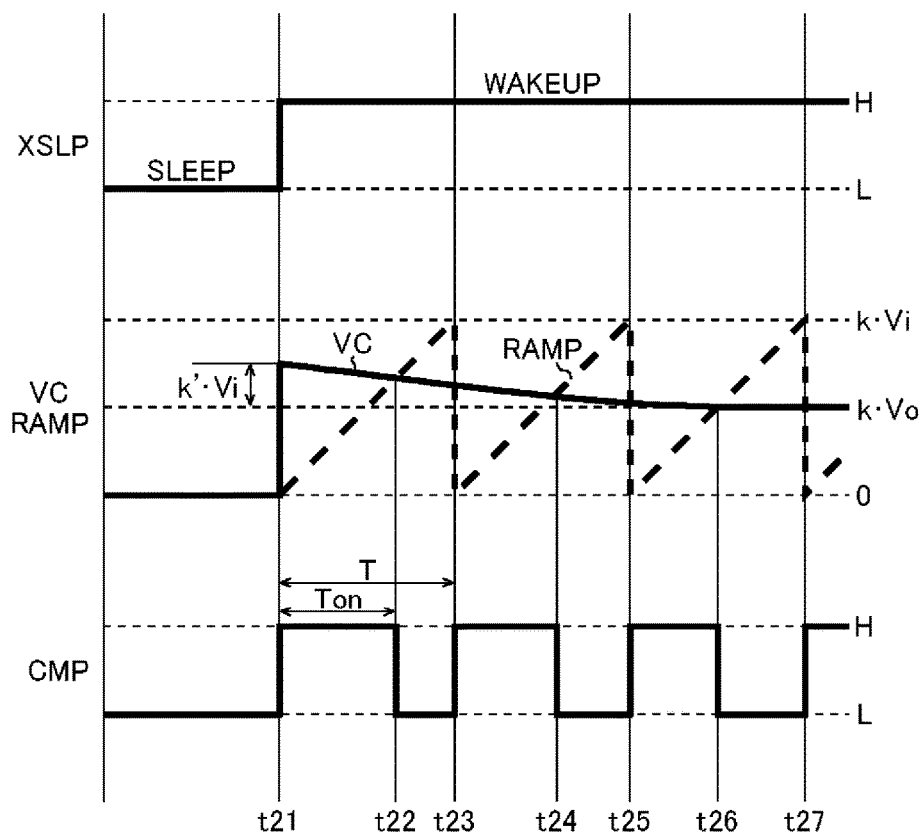
FIG. 4 is a timing chart showing duty-initial-value setting operation in the second embodiment.

FIG. 4 is a timing chart showing an example of duty-initial-value setting operation in the second embodiment.

Charted in the figure, in order from above to below, are the sleep control signal XSLP, the first voltage VC (solid line) plus the second voltage RAMP (broken line), and the comparison signal CMP.

Prior to time t21, the sleep control signal XSLP has been set at low level, and the DC/DC converter 1 has been shifted to power-saving sleep mode. In this case, in the phase compensation circuit 40, continuity between the noninverting input terminal (+) of the PWM comparator 60 and the output terminal of the error amplifier 30 is interrupted while continuity between the second terminal of the capacitor C1 and the ground terminal is made, resulting in a state in which the second terminal of the capacitor C2 is connected to an application terminal of the output voltage Vo and moreover the second terminal of the capacitor C3 is connected to the application terminal of the input voltage Vi. Accordingly, there arises a discharged state across the capacitor C1 while the capacitor C2 is charged with the output voltage Vo applied thereacross and moreover the capacitor C3 is charged with the input voltage Vi applied thereacross. In the sleep mode, the first voltage VC and the second voltage RAMP both come to 0 V, and the comparison signal CMP comes to low level.

When the sleep control signal XSLP is raised to high level at time t21, the DC/DC converter 1 returns to wakeup mode. In this case, in the phase compensation circuit 40, continuity between the noninverting input terminal (+) of the PWM comparator 60 and the output terminal of the error amplifier 30 is made while continuity between the second terminal of the capacitor C1 and the ground terminal is interrupted, resulting in a state in which the second terminals of the capacitors C2 and C3 are both connected to the second terminal of the capacitor C1.

That is, as the sleep mode is canceled, the phase compensation capacitor part 42 results in a state in which the capacitor C1 discharged thereacross, and the capacitors C2 and C3 charged with the output voltage Vo and the input voltage Vi, respectively, applied thereacross are connected in parallel to each other.

As a consequence, without awaiting the start-up of the error amplifier 30, the first voltage VC is promptly raised up to VC=k×Vo+k'×Vi (=(C2×Vo+C3×Vi)/(C1+C2+C3)}) according to the charge partitioning law for correlation among the capacitors C1 to C3. That is, in this embodiment, the initial value of the first voltage VC at the sleep-mode cancellation is offset higher by an extent of k'×Vi, as compared with the foregoing first embodiment.

After time t21 on, the oscillator 50 keeps in the operating state, in which the ramp-waveform second voltage RAMP to be pulse driven at the switching frequency fsw (=1/T) is generated. In addition, as described above, the amplitude of the second voltage RAMP is set as a variable value (=k×Vi) responsive to the input voltage Vi.

Consequently, the on-duty Don (equivalent to duty initial value) at the sleep-mode cancellation becomes (Vo/Vi)+(k'/k). That is, the duty initial value in this embodiment is set to a value intentionally heightened over a duty theoretical value (=Vo/Vi) derived when the input voltage Vi is stepped down to generate a desired output voltage Vo.

In addition, the first voltage VC is decreased by the function of the output feedback loop to such an extent that VC=k×Vo. That is, the on-duty Don of the DC/DC converter 1 tends to converge to the above-mentioned duty theoretical value (=Vo/Vi) as time elapses.

As described above, under the condition that the number of divided capacitors in the phase compensation capacitor part 42 is set to three or more, and that the individual capacitors charged with different bias voltages, respectively, it is made possible to arbitrarily adjust the initial value of the first voltage VC while the same effects as in the first embodiment remain enjoyable. Accordingly, since the duty initial value at the sleep-mode cancellation can be optimized in consideration of output loop characteristics of the DC/DC converter 1 as an example, it becomes implementable to more properly prevent the overshoot and undershoot of the output voltage Vo.

In particular, using the existing output voltage Vo and input voltage Vi in the DC/DC converter 1 as the bias voltages for charging of the capacitors C2 and C3 eliminates the need for preparing additional bias voltages. However, when it is undesirable to increase the divisional number of capacitors, charging the capacitor C2 with an arbitrary bias voltage (=Vo+α) higher than the output voltage Vo in the foregoing first embodiment (FIG. 1) allows the same effects as in this embodiment to be obtained.

<Third Embodiment>

Figure 5:
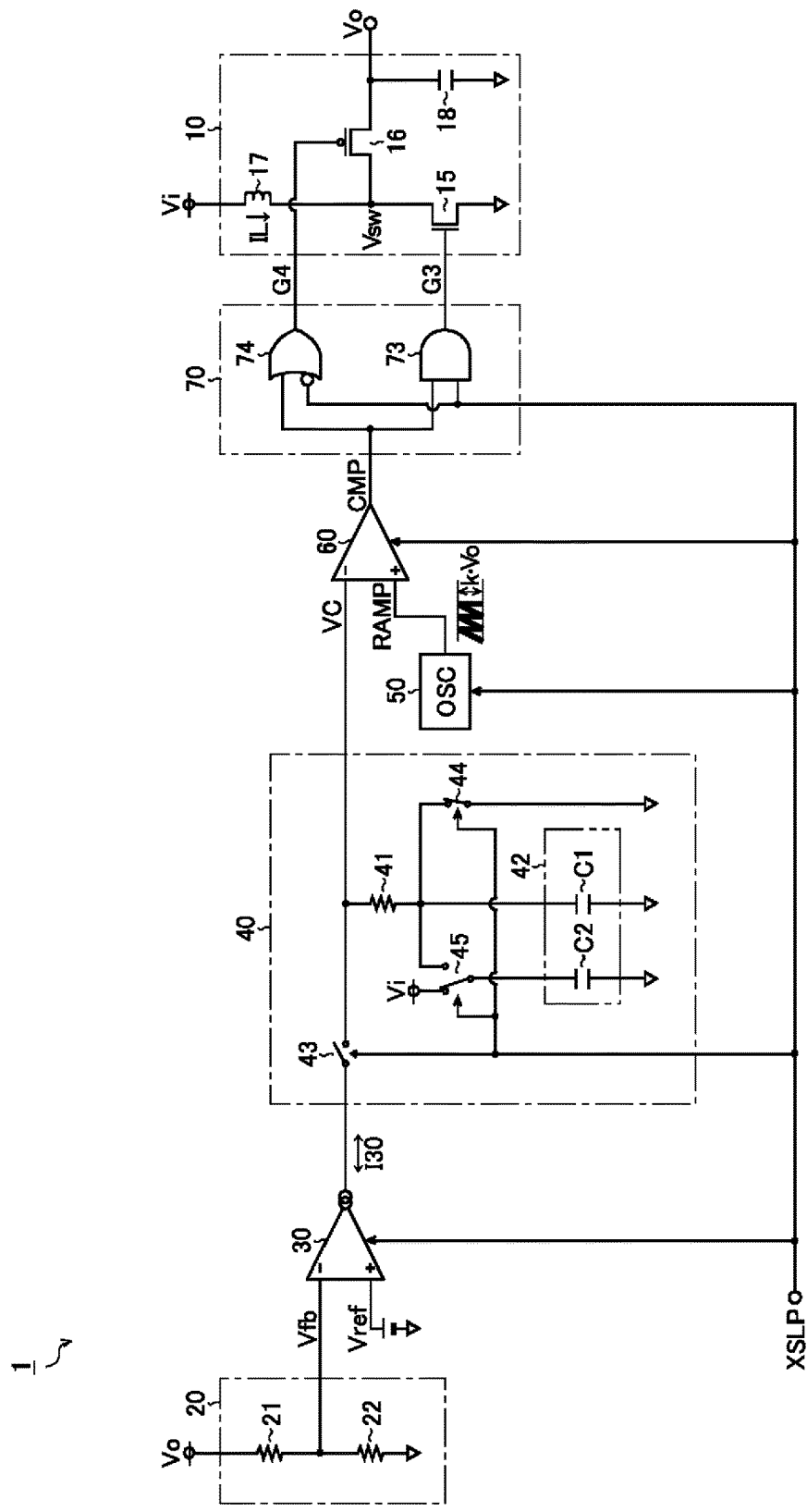
FIG. 5 is a circuit diagram showing a third embodiment of the DC/DC converter.

FIG. 5 is a circuit diagram showing a third embodiment of the DC/DC converter. The DC/DC converter 1 of this embodiment is based on the first embodiment (FIG. 1) and moreover characterized in that the switch output stage 10 is changed from the step-down type to the step-up type. Therefore, the same component elements as in the first embodiment are designated by the same reference signs as in FIG. 1 with their repetitive description omitted, and characterizing parts of the third embodiment will be described emphatically below.

The switch output stage 10 is a step-up type one which steps up an input voltage Vi to generate a desired output voltage Vo. The switch output stage 10 includes an output transistor 15 (NMOSFET in this figure), a synchronous rectifier transistor 16 (PMOSFET in this figure), a coil 17, and a capacitor 18.

A first terminal of the coil 17 is connected to the input terminal of the input voltage Vi. A second terminal of the coil 17 is connected to the drain of the output transistor 15 and the drain of the synchronous rectifier transistor 16. The source of the output transistor 15 is connected to a ground terminal. The source of the synchronous rectifier transistor 16 and the first terminal of the capacitor 18 are both connected to an application terminal of an output voltage Vo. A second terminal of the capacitor 18 is connected to a ground terminal.

The gate of the output transistor 15 is connected to an application terminal of a gate signal G3. The output transistor 15 is turned on with the gate signal G3 at high level, and turned off with the gate signal G3 at low level. The gate of the synchronous rectifier transistor 16 is connected to an application terminal of a gate signal G4. The synchronous rectifier transistor 16 is turned off with the gate signal G4 at high level, and turned on with the gate signal G4 at low level.

The output transistor 15 and the synchronous rectifier transistor 16 are turned on/off complementarily in response to the gate signals G3 and G4. By such on/off operations, a rectangular wave-shaped switch voltage Vsw to be pulse driven between the input voltage Vi and the ground voltage GND is generated at the second terminal of the coil 17. It is noted that the term 'complementarily' refers to not only cases where on/off states of the output transistor 15 and the synchronous rectifier transistor 16 are fully reversed therebetween, but also cases where simultaneous off time (dead time) of both transistors is provided.

When the output transistor 15 is turned on and the synchronous rectifier transistor 16 is turned off, a coil current IL directed toward the ground terminal flows through the coil 17 via the output transistor 15, so that electric energy of the coil current IL is accumulated. In this case, the switch voltage Vsw decreases near to the ground voltage GND via the output transistor 15. In addition, since the synchronous rectifier transistor 16 has been turned off, there flows no current from the capacitor 18 toward the output transistor 15.

On the other hand, when the output transistor 15 is turned off and the synchronous rectifier transistor 16 is turned on, electric energy accumulated in the coil 17 is released as an electric current by counter electromotive force generated in the coil 17. In this case, the coil current IL flowing via the synchronous rectifier transistor 16 flows as an output current from the output terminal of the output voltage Vo into the load, and moreover flows also to the ground terminal via the capacitor 18, so that the capacitor 18 is charged. By the above operations being repeated, the load is supplied with an output voltage Vo derived from stepping-up of the input voltage Vi.

In addition, in cases where a high voltage is applied to the switch output stage 10, high withstand voltage devices such as power MOSFETs, IGBTs and SiC transistors may appropriately be used as the output transistor 15 and the synchronous rectifier transistor 16. This point is in common with the foregoing first to third embodiments.

Due to the change of the switch output stage 10 from the step-down type to the step-up type, changes are made also on the phase compensation circuit 40, the oscillator 50, the PWM comparator 60, and the driver 70, respectively. Changed points of the individual parts will be described below.

In the phase compensation circuit 40, the bias voltage for charging of the capacitor C2 is changed from the output voltage Vo to the input voltage Vi.

In the oscillator 50, the amplitude of the second voltage RAMP is changed from a variable value (=k×Vi) responsive to the input voltage Vi to a variable value (=k×Vo) responsive to the output voltage Vo.

The PWM comparator 60 is inverted in its input polarity relative to that of the first to third embodiments. That is, the first voltage VC is inputted to the inverting input terminal (−) of the PWM comparator 60 while the second voltage RAMP is inputted to the noninverting input terminal (+) of the PWM comparator 60. Accordingly, in terms of logical level, the comparison signal CMP goes low level with the first voltage VC higher than the second voltage RAMP, and goes high level with the first voltage VC lower than the second voltage RAMP, as reverse to the first to third embodiments.

The driver 70, including an AND gate 73 and an OR gate 74 instead of the NAND gate 71 and the AND gate 72, generates gate signals G3 and G4 (equivalent to drive signals for the switch output stage 10, respectively) in response to the comparison signal CMP. More specifically, the AND gate 73 outputs, as the gate signal G3, a NAND operation signal of the sleep control signal XSLP and the comparison signal CMP. Also, the OR gate 74 outputs, as the gate signal G4, an AND operation signal of the comparison signal CMP and the invertedly-inputted sleep control signal XSLP.

Accordingly, when the sleep control signal XSLP is at high level, the gate signals G3 and G4 basically each become a logical signal identical to the comparison signal CMP. More specifically, when the comparison signal CMP is at high level, the gate signals G3 and G4 both go high level, so that the output transistor 15 is turned on and the synchronous rectifier transistor 16 is turned off. Conversely, when the comparison signal CMP is at low level, the gate signals G3 and G4 both go low level, so that the output transistor 15 is turned off and the synchronous rectifier transistor 16 is turned on.

Meanwhile, when the sleep control signal XSLP is at low level, the gate signal goes low level independently of the comparison signal CMP while the gate signal G4 goes high level independently of the comparison signal CMP. Consequently, the output transistor 15 and the synchronous rectifier transistor 16 are both turned off.

Figure 6:
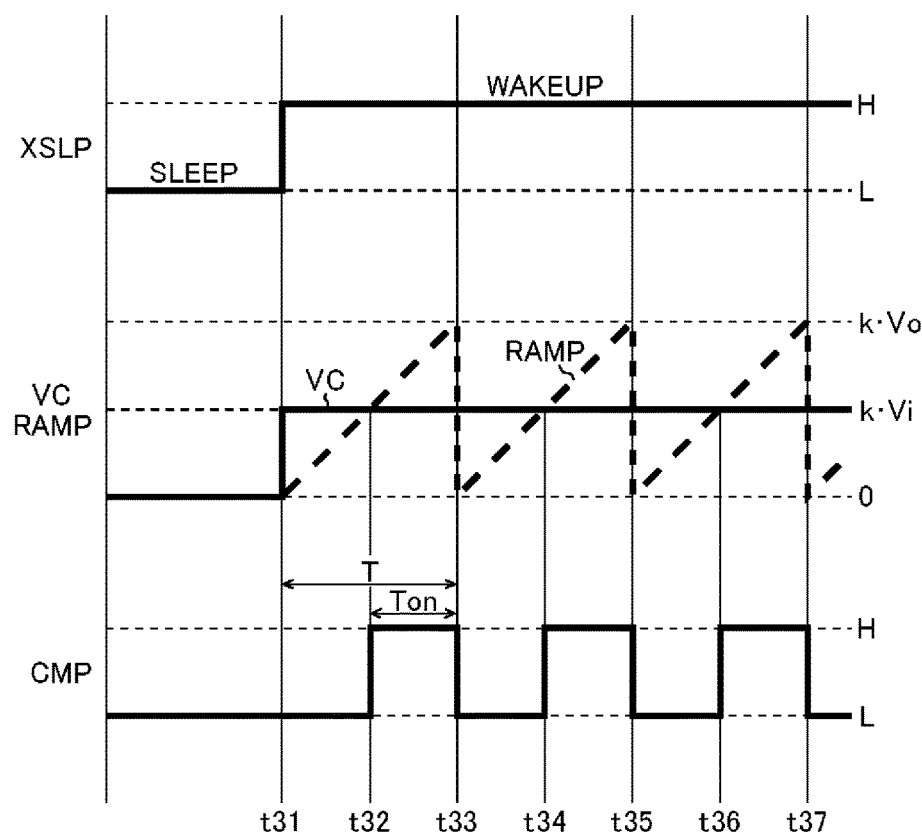
FIG. 6 is a timing chart showing duty-initial-value setting operation in the third embodiment.

FIG. 6 is a timing chart showing an example of duty-initial-value setting operation in the third embodiment. Charted in the figure, in order from above to below, are the sleep control signal XSLP, the first voltage VC (solid line) plus the second voltage RAMP (broken line), and the comparison signal CMP.

Prior to time t31, the sleep control signal XSLP has been set at low level, and the DC/DC converter 1 has been shifted to power-saving sleep mode. In this case, in the phase compensation circuit 40, continuity between the noninverting input terminal (+) of the PWM comparator 60 and the output terminal of the error amplifier 30 is interrupted while continuity between the second terminal of the capacitor C1 and the ground terminal is made, resulting in a state in which the second terminal of the capacitor C2 is connected to an application terminal of the output voltage Vo. Accordingly, there arises a discharged state across the capacitor C1 while the capacitor C2 is charged with the input voltage Vi applied thereacross. In the sleep mode, the first voltage VC and the second voltage RAMP both come to 0 V, and the comparison signal CMP comes to low level. These points are unchanged except that the bias voltage applied to the capacitor C2 is changed from the output voltage Vo to the input voltage Vi.

When the sleep control sign XSLP is raised to high level at time the DC/DC converter 1 returns to wakeup mode. In this case, in the phase compensation circuit 40, continuity between the noninverting input terminal (+) of the PWM comparator 60 and the output terminal of the error amplifier 30 is made while continuity between the second terminal of the capacitor C1 and the ground terminal is interrupted, resulting in a state in which the second terminal of the capacitor C2 is connected to the second terminal of the capacitor C1.

That is, as the sleep mode is canceled, the phase compensation capacitor part 42 results in a state in which the capacitor C1 discharged thereacross and the capacitor C2 charged with the input voltage Vi applied thereacross are connected in parallel to each other.

As a consequence, without awaiting the start-up of the error amplifier 30, the first voltage VC is promptly raised up to VC=k×Vi (={C2/(C1+C2)}×Vi) according to the charge partitioning law for correlation between the capacitors C1 and C2.

After time t31 on, the oscillator 50 keeps in the operating state, in which the ramp-waveform second voltage RAMP to be pulse driven at the switching frequency fsw (=1/T) is generated. In addition, as described above, the amplitude of the second voltage RAMP is set as a variable value (=k×Vo) responsive to the output voltage Vo.

In this connection, the on-duty Don (=Ton/T) of the DC/DC converter 1 depends on a comparison result between the first voltage VC and the second voltage RAMP. In more detail, starting at a timing when the first voltage VC (=k×Vi) and the second voltage RAMP (=(k×Vo/T)×(T−Ton)) coincides with each other, the on-duty Don (equivalent to duty initial value) at the sleep-mode cancellation becomes 1−(Vi/Vo). This duty initial value coincides with a duty theoretical value derived when the input voltage Vi is stepped up to generate a desired output voltage Vo. Accordingly, overshoot and undershoot of the output voltage Vo at the sleep-mode cancellation can be prevented even with the switch output stage 10 provided as a step-up type.

Of course, even with this embodiment adopted, it is needless to say that the same effects as in the first embodiment, i.e. saving of the power consumption and reduction in the restart time, can be obtained.

Also, although this embodiment has been described above on a case which is based on the first embodiment (FIG. 1) and in which the switch output stage 10 is changed to a step-up type, yet the embodiment may also be based on the second embodiment (FIG. 3). In that case, it is appropriate that, for example, the first bias voltage for charging of the capacitor C2 is given by the input voltage Vi and the second bias voltage for charging of the capacitor C3 is given by the output voltage Vo.

In the foregoing first to third embodiments, the step-down type (FIGS. 1 and 3) and the step-up type (FIG. 5) have been taken as examples of the output form of the switch output stage 10. However, the step-up/down type or the inversion type may also be adopted. Also as to the rectification method of the switch output stage 10, the above-described synchronous rectification method is not limitative and may be changed to the diode rectification method (i.e., method using a rectifier diode instead of the synchronous rectifier transistor). Further, as to the output feedback control method of the DC/DC converter 1, the above-described voltage mode control method is not limitative and the current mode control method may be adopted.

<Fourth Embodiment>

Figure 7:
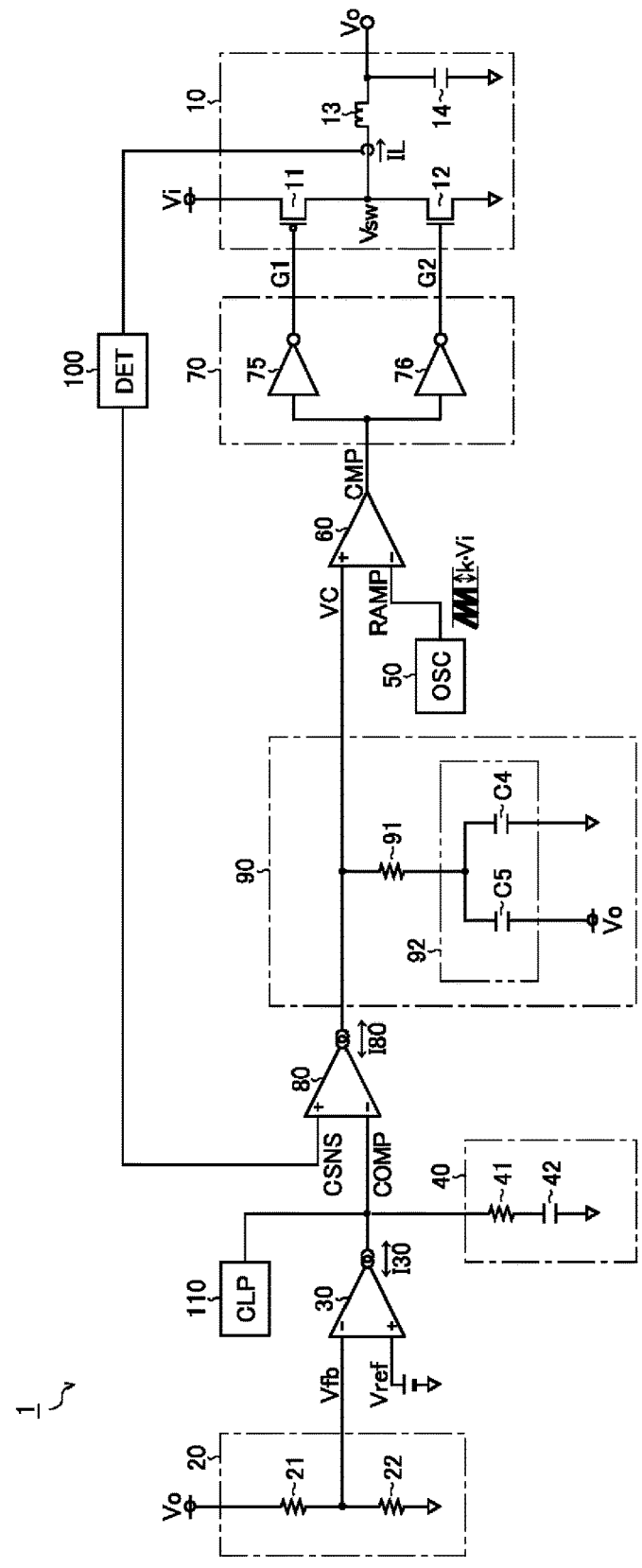
FIG. 7 is a circuit diagram showing a fourth embodiment of the DC/DC converter.

FIG. 7 is a circuit diagram showing a fourth embodiment of the DC/DC converter. The DC/DC converter 1 of this embodiment, being a step-down type switching power supply adopting the current mode control method, includes a switch output stage 10, a feedback voltage generator 20, an error amplifier 30 (equivalent to a first amplifier), a first phase compensation circuit 40, an oscillator 50, a PWM comparator 60, a driver 70, a differential amplifier 80 (equivalent to second amplifier), a second phase compensation circuit 90, a current detector 100, and a clamper 110.

Most of the above-described component elements are in common to those of the first embodiment (FIG. 1). Therefore, the same component elements as in the first embodiment are designated by the same reference signs as in FIG. 1 with their repetitive description omitted, and characterizing parts of the fourth embodiment will be described emphatically below.

The switch output stage 10, the feedback voltage generator 20, and the error amplifier 30 are absolutely the same as those of the first embodiment (FIG. 1).

The first phase compensation circuit 40, equivalent to the phase compensation circuit 40 of the first embodiment (FIG. 1), generates an error voltage COMP upon receiving input of a first error current signal I30 from the error amplifier 30. However, since the shifting-to-sleep mode function is eliminated in the DC/DC converter 1 of this embodiment, the capacitor of the phase compensation capacitor part 42 is not divided into plurality, nor are the switches 43 to 45 provided, unlike the first embodiment (FIG. 1).

The oscillator 50 and the PWM comparator 60 are absolutely the same as those of the first embodiment (FIG. 1).

The driver 70 is so modified, due to the elimination of the sleep mode, that inverters 75 and 76 are included instead of the NAND gate 71 and the AND gate 72. The inverters 75 and 76 output logically inverted signals of the comparison signal CMP as the gate signals G1 and G2, respectively. Accordingly, when the comparison signal CMP is at high level, the gate signals G1 and G2 both go low level, so that the output transistor 11 is turned on and the synchronous rectifier transistor 12 is turned off. Conversely, when the comparison signal CMP is at low level, the gate signals G1 and G2 both go high level, so that the output transistor 11 is turned off and the synchronous rectifier transistor 12 is turned on.

The differential amplifier 80, like the error amplifier 30, is a current-output type transconductance amplifier (so-called gm amplifier), which generates a second error current signal 180 responsive to a differential between an error voltage COMP applied to the inverting input terminal (−) and a current sense voltage CSNS applied to the noninverted input terminal (+). The second error current signal 180 flows in a positive direction (i.e., direction leading from the differential amplifier 80 toward the second phase compensation circuit 90) when the error voltage COMP is lower than the current sense voltage CSNS, and the second error current signal 180 flows in a negative direction (i.e., direction leading from the second phase compensation circuit 90 toward the differential amplifier 80) when the error voltage COMP is higher than the current sense voltage CSNS.

The second phase compensation circuit 90 is connected between the differential amplifier 80 and the PWM comparator 60, and generates a first voltage VC upon receiving input of the second error current signal 180. Configuration and operation of the second phase compensation circuit 90 will be described later.

The current detector 100 generates a current sense voltage CSNS responsive to a coil current IL flowing through the switch output stage 10. The current sense voltage CSNS, for example, becomes higher and higher with increasing average value IL(ave) of the coil current IL and, conversely, becomes lower and lower with decreasing average value IL(ave) of the coil current IL.

The clamper 110 restricts the error voltage COMP to a specified upper-limit voltage value VLMT or less. As a result, the differential amplifier 80 is subject to such output feedback control that the current sense voltage CSNS responsive to the coil current IL is restricted to the upper-limit voltage value VLMT or less. Thus, the coil current IL is restricted to an upper-limit current value ILMT or less.

<Second Phase Compensation Circuit>

With reference still to FIG. 7, configuration and operation of the second phase compensation circuit 90 will be described in detail. The second phase compensation circuit 90 in this figure includes a phase compensation resistor part 91 and a phase compensation capacitor part 92 to compensate the phase of the first voltage VC, thereby preventing oscillations of the output feedback loop.

The phase compensation capacitor part 92 includes capacitors C4 and C5. A first terminal of the capacitor C4 is connected to a ground terminal. Meanwhile, a first terminal of the capacitor C5 is connected to an application terminal of an output voltage Vo. Given a capacitance value C of the whole phase compensation capacitor part 92, a capacitance value C4 of the capacitor C4, and a capacitance value C5 of the capacitor C5, then it is satisfied that $C=C4+C5$, $C5/C4=k1(1-k)$ (where $0<k<1$). In the compensation capacitor part 92 of this embodiment, as can be seen above, two divided capacitors for use of phase compensation are included, where the output voltage Vo of the DC/DC converter 1 is applied as a monitoring-target voltage to a grounding-side node of at least one capacitor (first terminal of the capacitor C5 in this figure). Technical significance of this arrangement will be described later.

The phase compensation resistor part 91 includes resistor having a first terminal connected to the noninverting input terminal (+) of the PWM comparator 60 as well as a second terminal connected to respective second terminals of the capacitors C4 and C5.

Figure 8:
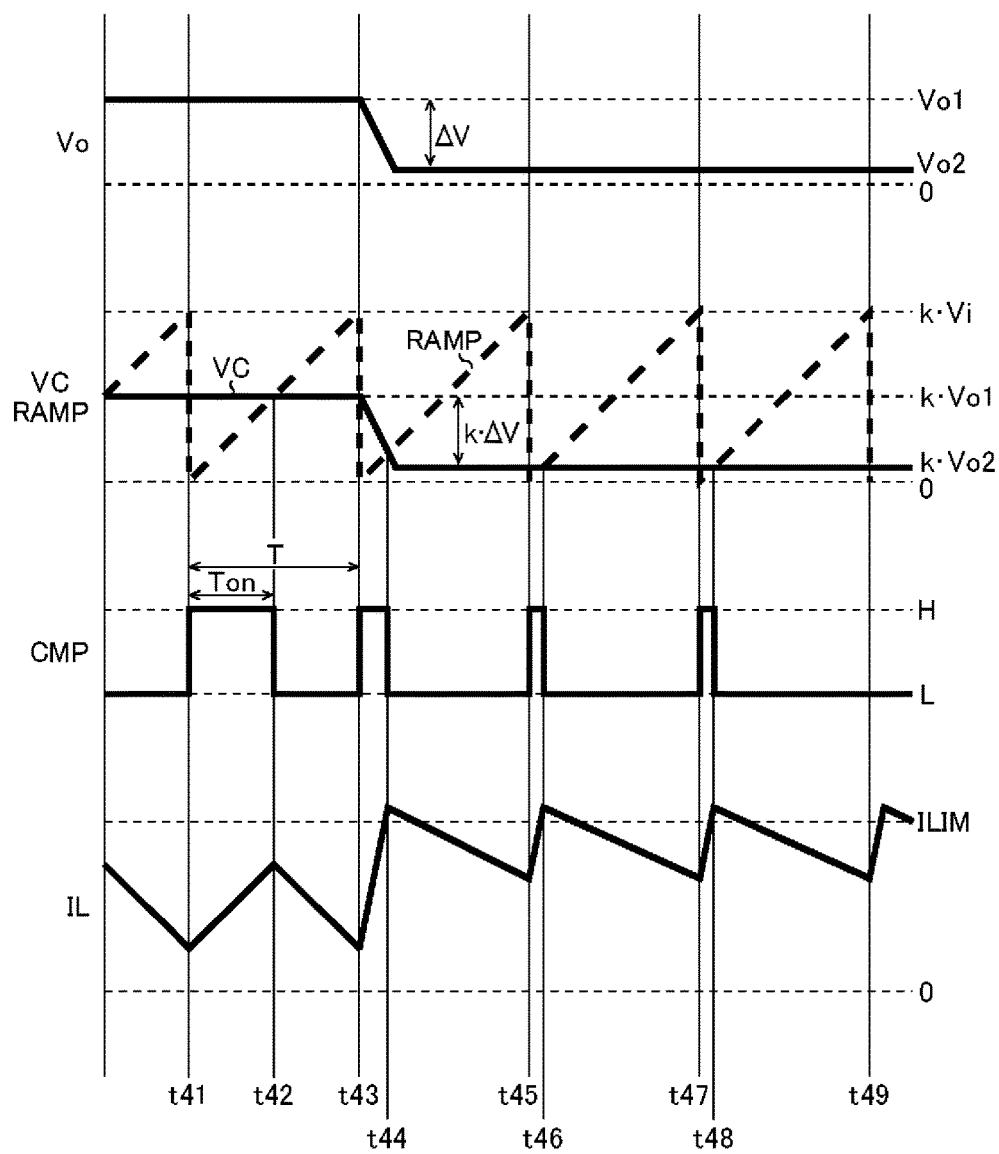
FIG. 8 is a timing chart showing rush-current suppressing operation in the fourth embodiment.

FIG. 8 is a timing chart showing an example of rush-current suppressing operation in the fourth embodiment. Charted in the figure, in order from above to below, are the output voltage Vo, the first voltage VC (solid line) plus the second voltage RAMP (broken line), the comparison signal CMP, and the coil current IL.

Prior to time t43, there has occurred no short circuit of the switch output stage 10, so that the output voltage Vo maintained at its target value Vo1. Also, since the first voltage VC is maintained at k×Vo1 by a function of the output feedback loop, the on-duty Don (=Ton/T) of the DC/DC converter 1 coincides with a duty theoretical value (=Vo1/Vi) derived when the input voltage Vi is stepped down to generate a desired output voltage Vo (=Vo1).

Meanwhile, when a short circuit of the switch output stage 10 arises at time t43 so that the output voltage Vo abruptly drops from the target value Vo1 to an abnormal value Vo2, the first voltage VC abruptly drops in the same behavior as the output voltage Vo according to the charge partitioning law for correlation between the capacitors C4 and C5 without awaiting response of the output feedback loop.

In particular, in the DC/DC converter 1 of this embodiment, it is satisfied that C5/C4=k/(1−k) (where 0<k<1). Therefore, when the output voltage Vo has changed by ΔV, the first voltage VC changes by k×ΔV. Also, the amplitude of the second voltage RAMP is set as a variable value (=k×Vi) responsive to the input voltage Vi, as described before.

With such settings provided, the on-duty Don of the DC/DC converter 1 is shifted to the duty theoretical value (=Vo2/Vi) responsive to the abnormal value Vo2 of the output voltage Vo simultaneously with occurrence of a short circuit of the switch output stage 10. As a result, a rush current (i.e., an excessive coil current IL) arising upon short-circuit emergency of the switch output stage 10 can effectively be suppressed, making it achievable to prevent deterioration of devices forming the switch output stage 10.

With a configuration in which the second phase compensation circuit 90 is used to implement duty follow-up control responsive to transient fluctuations of the output voltage Vo, it becomes unnecessary to enhance the response speed of the differential amplifier 80 or the clamper 110. Consequently, the voltage loop characteristic is not changed, nor does oscillation risk increase.

Also with the DC/DC converter 1 of this embodiment adopted, the amplitude of the second voltage RAMP fluctuates depending on the input voltage Vi. Therefore, even in event of an abrupt change in the input voltage Vi, the on-duty Don of the DC/DC converter 1 can be adjusted up to a proper value, making it achievable to suppress rush currents.

<Fifth Embodiment>

Figure 9:
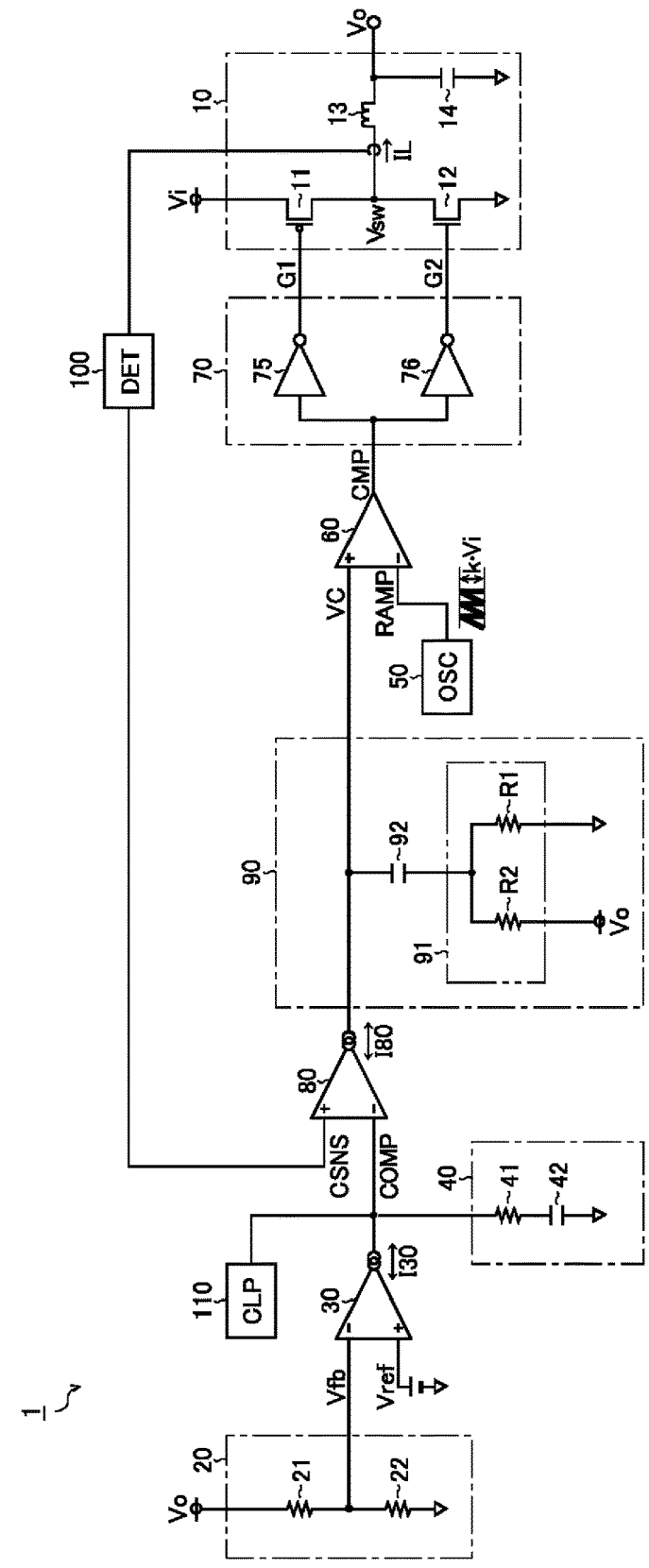
FIG. 9 is circuit diagram showing a fifth embodiment of the DC/DC converter.

FIG. 9 is circuit diagram showing a fifth embodiment of the DC/DC converter. The DC/DC converter 1 of this embodiment is based on the fourth embodiment (FIG. 7) and moreover characterized by including a plurality of divided resistors in the phase compensation resistor part 91 instead of including a plurality of divided capacitors in the phase compensation capacitor part 92. Therefore, the same component elements as in the fourth embodiment are designated by the same reference signs as in FIG. 7 with their repetitive description omitted, and characterizing parts of the fifth embodiment will be described emphatically below.

The phase compensation resistor part 91 includes resistors R1 and R2. A first terminal of the resistor R1 is connected to a ground terminal. A first terminal of the resistor R2 is connected to the application terminal of the output voltage Vo. Given a resistance value R of the whole phase compensation resistor part 91, a resistance value R1 of the resistor R1, and a resistance value R2 of the resistor R2, then it is satisfied that R=R1//R2, R1/R2=k/(1−k) (where 0<k<1). In the phase compensation resistor part 91 of this embodiment, as can be seen above, two divided resistors for use of phase compensation are included, where the output voltage of the DC/DC converter 1 is applied as a monitoring-target voltage to a grounding-side node of at least one resistor (first terminal of the resistor R2 in this figure).

The phase compensation capacitor part 92 includes a capacitor having a first terminal connected to the noninverting input terminal (+) of the PWM comparator 60 as well as a second terminal connected to respective second terminals of the resistors R1 and R2.

In the DC/DC converter 1 of this embodiment, for example, when a short circuit of the switch output stage 10 arises so as to cause the output voltage Vo to abruptly drop, the first voltage VC abruptly drops in the same behavior as the output voltage Vo by voltage dividing action of the resistors R1 and R2 without awaiting response of the output feedback loop. Thus, the same effects as in the foregoing fourth embodiment (FIG. 7) can be enjoyed.

In particular, with this embodiment adopted, a partial voltage of the output voltage Vo is applied to the capacitor of the phase compensation capacitor part 92. Therefore, even when the output voltage Vo is relatively high, unnecessary enhancement of the withstand voltage of the capacitor is not involved, giving a preferable advantage for integration onto semiconductor devices.

<Sixth Embodiment>

Figure 10:
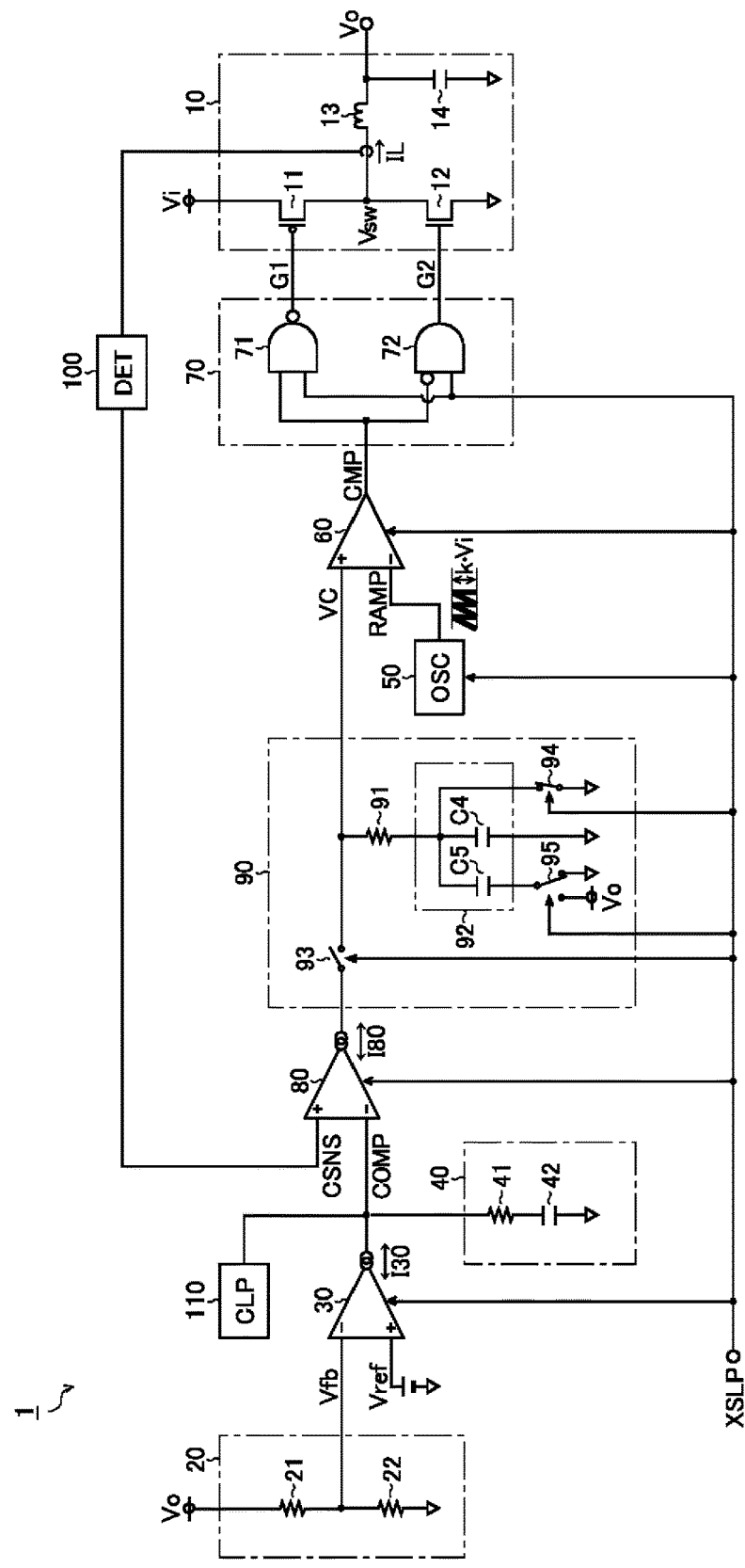
FIG. 10 is a circuit diagram showing a sixth embodiment of the DC/DC converter.

FIG. 10 is a circuit diagram showing a sixth embodiment of the DC/DC converter. The DC/DC converter 1 of this embodiment is based on the fourth embodiment (FIG. 7) and moreover characterized by having a function of shifting to sleep mode, as in the case of the foregoing first embodiment (FIG. 1). Therefore, the same component elements as in the fourth embodiment are designated by the same reference signs as in FIG. 7 with their repetitive description omitted, and characterizing parts of the fifth embodiment will be described emphatically below.

Along with introduction of the sleep mode, changes are made on the error amplifier 30, the oscillator 50, the PWM comparator 60, the driver 70, the differential amplifier 80, and the second phase compensation circuit 90, respectively. Changed points of the individual parts will be described below.

The error amplifier 30, the oscillator 50, the PWM comparator 60, and the differential amplifier 80 come to the operating state with the sleep control signal XSLP at high level (=logical level for sleep-mode cancellation), and come to the halted state with the sleep control signal XSLP at low level (=logical level for sleep mode).

The driver 70 includes a NAND gate 71 and an AND gate 72 instead of the inverters 75 and 76 to generate gate signals G1 and G2 in response to a comparison signal CMP and a sleep control signal XSLP. Circuit construction and operation of the driver 70 are the same as in the foregoing first embodiment (FIG. 1), and their repetitive description is omitted.

The second phase compensation circuit 90 includes switches 93 to 95 in addition to the phase compensation resistor part 91 and the phase compensation capacitor part 92.

The switch 93 makes electrical continuity/discontinuity between the noninverting input terminal (+) of the PWM comparator 60 and the output terminal of the differential amplifier 80 in response to the sleep control signal XSLP. More specifically, with the sleep control signal XSLP at high level, the switch 93 is turned on so as to make continuity between the noninverting input terminal (+) of the PWM comparator 60 and the output terminal of the differential amplifier 80. With the sleep control signal XSLP at low level, the switch 93 is turned off so as to make discontinuity between the noninverting input terminal (+) of the PWM comparator 60 and the output terminal of the differential amplifier 80.

The switch 94 makes electrical continuity/discontinuity between the second terminal of the capacitor C4 and the ground terminal in response to the sleep control signal XSLP. More specifically, with the sleep control signal XSLP at low level, the switch 94 is turned on so as to make continuity between the second terminal of the capacitor C4 and the ground terminal. With the sleep control signal XSLP at high level, the switch 94 is turned off so as to make discontinuity between the second terminal of capacitor C4 and the ground terminal.

The switch 95 changes over, in response to the sleep control signal XSLP, which the second terminal of the capacitor C5 is connected to the application terminal of the output voltage Vo (equivalent to the monitoring-target voltage) or to the ground terminal. More specifically, with the sleep control signal XSLP at low level, the switch 95 connects the second terminal of the capacitor C5 to the ground terminal. With the sleep control signal XSLP at high level, the switch 95 connects the second terminal of the capacitor C5 to the application terminal of the output voltage Vo.

In the second phase compensation circuit 90 configured as described above, at the sleep-mode cancellation (XSLP=H), continuity between the noninverting input terminal (+) of the PWM comparator 60 and the output terminal of the differential amplifier 80 is made, while continuity between the second terminal of the capacitor C4 and the ground terminal is interrupted, resulting in a state in which the second terminal of the capacitor C5 is connected to the application terminal of the output voltage Vo.

That is, as the sleep mode is canceled, the phase compensation capacitor part 92 results in a state in which the capacitors C4 and C5 are connected in series between the application terminal of the output voltage Vo and the ground terminal. As a consequence, without awaiting the start-up of the differential amplifier 80, the first voltage VC is promptly raised up to VC=k×Vo (={C4/(C4+C5)}×Vo) by capacity type voltage division of the capacitors C4 and C5. Thus, a duty initial value at the sleep-mode cancellation is set by using the second phase compensation circuit 90, as in the case of the foregoing first embodiment (FIG. 1).

Also, after the sleep-mode cancellation, the connection state of the phase compensation capacitor part 92 is fully equivalent to that of FIG. 7. Thus, duty follow-up control responsive to transient fluctuations of the output voltage Vo can be realized by using the second phase compensation circuit as in the case of the foregoing fourth embodiment (FIG. 7), so that rush currents arising upon short-circuit emergencies of the switch output stage 10 can effectively be suppressed.

With the DC/DC converter 1 of this embodiment adopted as described above, advantageous effects of both the first embodiment (FIG. 1) and the fourth embodiment (FIG. 7) can be enjoyed.

<Seventh Embodiment>

Figure 11:
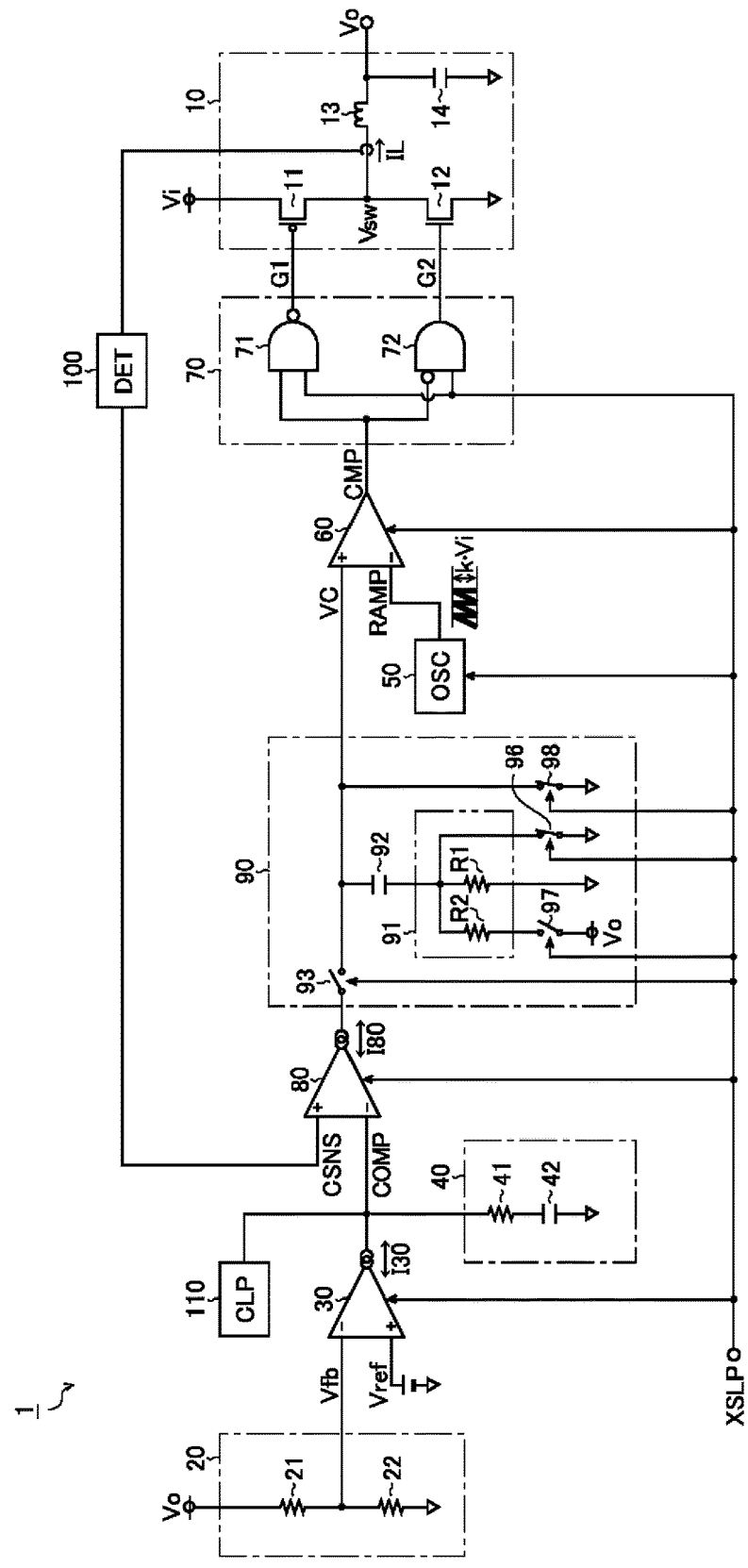
FIG. 11 is a circuit diagram showing a seventh embodiment of the DC/DC converter.

FIG. 11 is a circuit diagram showing a seventh embodiment of the DC/DC converter. The DC/DC converter 1 of this embodiment is based on the sixth embodiment (FIG. 10) and moreover characterized vb by including a plurality of divided resistors in the phase compensation resistor part 91 instead of including a plurality of divided capacitors in the phase compensation capacitor part 92. Due to this change, switches 96 to 98 are provided instead of the switches 94 and 95 in the second phase compensation circuit 90. Therefore, the same component elements as in the sixth embodiment are designated by the same reference signs as in FIG. 10 with their repetitive description omitted, and characterizing parts of the seventh embodiment will be described emphatically below.

The phase compensation resistor part 91 includes resistors R1 and R2. A first terminal of the resistor R1 is connected to a ground terminal. A first terminal of the resistor R2 is connected to an application terminal of the output voltage Vo via the switch 97. Given a resistance value R of the whole phase compensation resistor part 91, a resistance value R1 of the resistor R1, and a resistance value R2 of the resistor R2, then it is satisfied that R=R1//R2, R1/R2=k/(1−k) (where 0<k<1). This point is in common with the foregoing fifth embodiment (FIG. 9).

The phase compensation capacitor part 92 includes a capacitor having a first terminal connected to the noninverting input terminal (+) of the PWM comparator 60 as well as a second terminal connected to respective second terminals of the resistors R1 and R2.

The switch 96 makes electrical continuity/discontinuity between the second terminal of the resistor R1 and the ground terminal in response to the sleep control signal XSLP. More specifically, with the sleep control signal XSLP at low level, the switch 96 is turned on so as to make continuity between the second terminal of the resistor R1 and the ground terminal. With the sleep control signal XSLP at high level, the switch 96 is turned off so as to make discontinuity between the second terminal of the resistor R1 and the ground terminal.

The switch 97 makes electrical continuity/discontinuity between the second terminal of the resistor R2 and the application terminal of the output voltage Vo (equivalent to the monitoring-target voltage) in response to the sleep control signal XSLP. More specifically, with the sleep control signal XSLP at low level, the switch 97 is turned off so as to make discontinuity between the second terminal of the resistor R2 and the application terminal of the output voltage Vo. With the sleep control signal XSLP at high level, the switch 97 is turned on so as to make continuity between the second terminal of the resistor R2 and the application terminal of the output voltage Vo.

The switch 98 makes electrical continuity/discontinuity between the first terminal of the phase compensation capacitor part 92 and the ground terminal in response to sleep control signal XSLP. More specifically, with the sleep control signal XSLP at low level, the switch 98 is turned on so as to make continuity between the first terminal of the phase compensation capacitor part 92 and the ground terminal. With the sleep control signal XSLP at high level, the switch 98 is turned off so as to make discontinuity between the first terminal of the phase compensation capacitor part 92 and the ground terminal.

In the second phase compensation circuit 90 configured as described above, at the sleep-mode cancellation (XSLP=H), continuity between the noninverting input terminal (+) of the PWM comparator 60 and the output terminal of the differential amplifier 80 is made, while continuity between the second terminal of the resistor R1 and the ground terminal as well as continuity between the first terminal of the phase compensation capacitor part 92 and the ground terminal are both interrupted, resulting in a state in which the second terminal of the resistor R2 is connected to the application terminal of the output voltage Vo.

That is, as the sleep mode is canceled, the phase compensation resistor part 91 results in a state in which the resistors R1 and R2 are connected in series between the application terminal of the output voltage Vo and the ground terminal. As a consequence, without awaiting the start-up of the differential amplifier 80, the first voltage VC is promptly raised up to VC=k×Vo (={R1/(R1+R2)}×Vo) by resistance type voltage division of the resistors R1 and R2. Thus, a duty initial value at the sleep-mode cancellation is set by using the second phase compensation circuit 90, as in the case of the foregoing first embodiment (FIG. 1).

Also, after the sleep-mode cancellation, the connection state of the phase compensation resistor part 91 is fully equivalent to that of FIG. 9. Thus, duty follow-up control responsive to transient fluctuations of the output voltage Vo can be realized by using the second phase compensation circuit 90, as in the case of the foregoing fifth embodiment (FIG. 9), so that rush currents arising upon short-circuit emergencies of the switch output stage 10 can effectively be suppressed.

In particular, with this embodiment adopted, a partial voltage of the output voltage Vo is applied to the capacitor of the phase compensation capacitor part 92. Therefore, even when the output voltage Vo is relatively high, unnecessary enhancement of the withstand voltage of the capacitor is not involved, giving a preferable advantage for integration onto semiconductor devices.

With the DC/DC converter 1 of this embodiment adopted as described above, advantageous effects of both the first embodiment (FIG. 1) and the fifth embodiment (FIG. 9) can be enjoyed.

<Eighth Embodiment>

Figure 12:
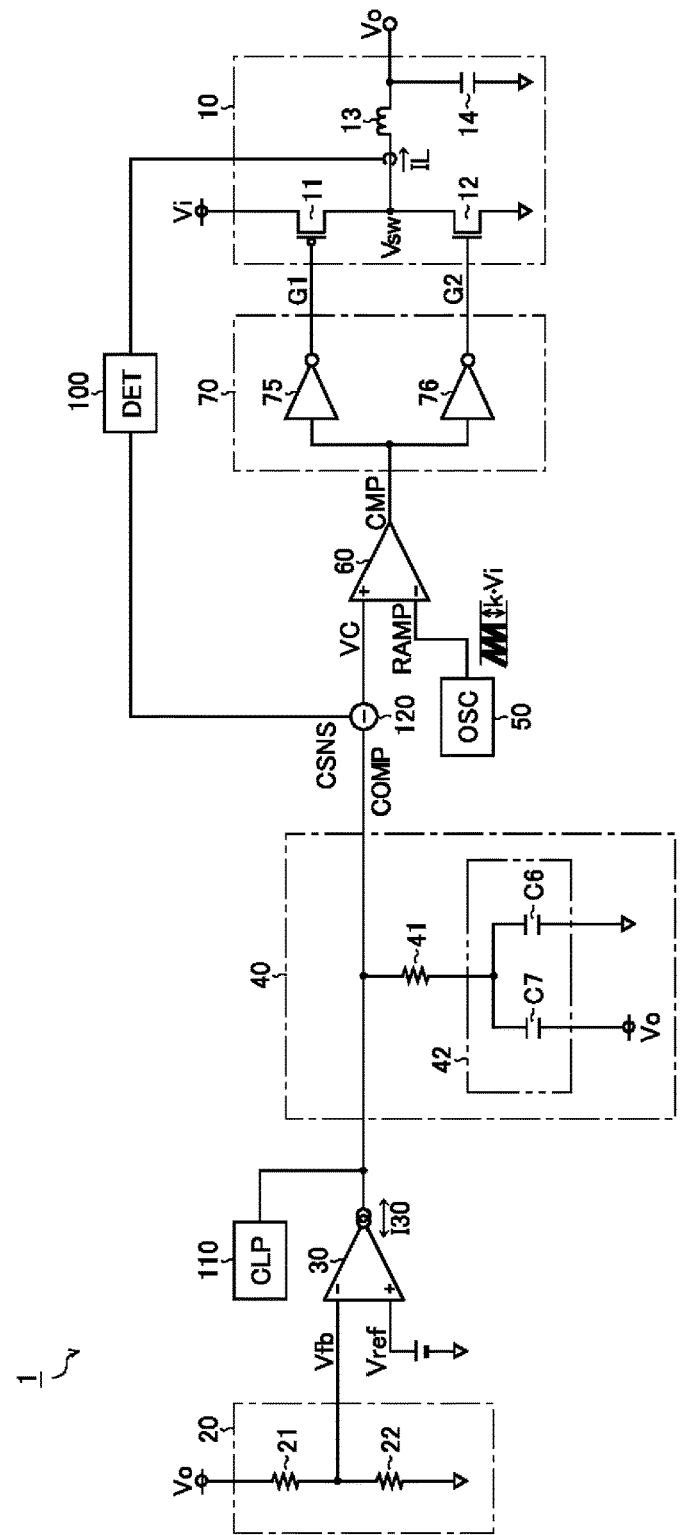
FIG. 12 is a circuit diagram showing an eighth embodiment of the DC/DC converter.

FIG. 12 circuit diagram showing an eighth embodiment of the DC/DC converter. The DC/DC converter 1 of this embodiment is based on the fourth embodiment (FIG. 7) and moreover characterized in that the current sense voltage CSNS is fed back and inputted to a computing unit 120 instead of the differential amplifier 80. Due to this change, the second phase compensation circuit 90 is excluded and its function is transferred to the phase compensation circuit 40. Therefore, the same component elements as in the fourth embodiment are designated by the same reference signs as in FIG. 7 with their repetitive description omitted, and characterizing parts of the eighth embodiment will be described emphatically below.

The phase compensation circuit 40 includes a phase compensation resistor part 41 and a phase compensation capacitor part 42 to compensate the phase of the error voltage COMP, thereby preventing oscillations of the output feedback loop.

The phase compensation capacitor part 42 includes capacitors C6 and C7. A first terminal of the capacitor C6 is connected to a ground terminal. Meanwhile, a first terminal of the capacitor C7 is connected to an application terminal of the output voltage Vo. Given a capacitance value C of the whole phase compensation capacitor part 42, a capacitance value C6 of the capacitor C6, and a capacitance value C7 of the capacitor C7, then it is satisfied that C=C6+C7, C7/C6=k/(1−k) (where 0<k<1). In the phase compensation capacitor part 42 of this embodiment, as can be seen above, two divided capacitors for use of phase compensation are included, where the output voltage Vo of the DC/DC converter 1 is applied as a monitoring-target voltage to a grounding-side node of at least one capacitor (first terminal of the capacitor C7 in this figure).

The phase compensation resistor part 41 includes a resistor having a first terminal connected to an output terminal of the error amplifier 30 as well as a second terminal connected to respective second terminals of the capacitors C6 and C7.

The computing unit 120 performs a computing process of an error voltage COMP and a current sense voltage CSNS (e.g., subtracting process of subtracting the current sense voltage CSNS from the error voltage COMP) to generate a first voltage VC (=COMP−CSNS).

Even in such a case where the current mode control method is implemented by using the computing unit 120, setting the phase compensation circuit 40 equivalent in circuit construction to that of FIG. 7 makes it possible to enjoy the same effects as in the foregoing fourth embodiment (FIG. 7). Also, the phase compensation circuit 40 may be set equivalent in circuit construction to that of FIG. 9.

<Ninth Embodiment>

Figure 13:
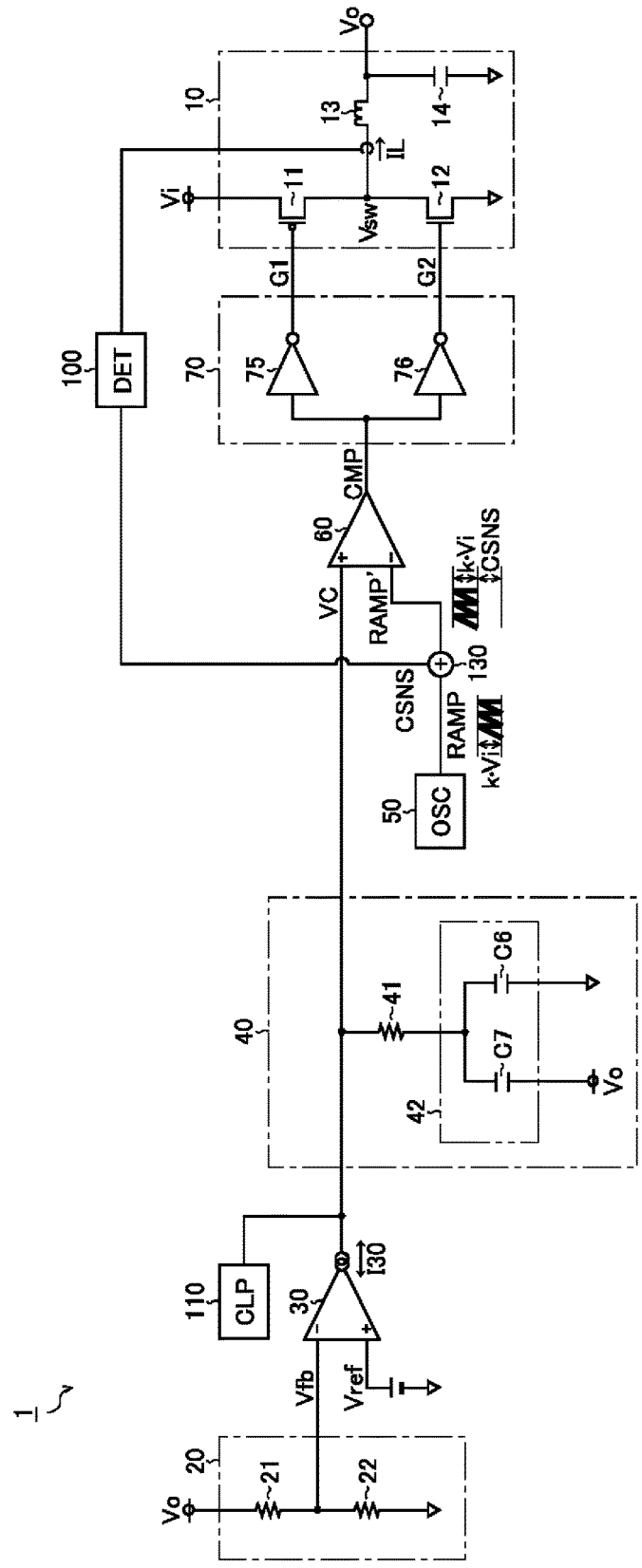
FIG. 13 is a circuit diagram showing a ninth embodiment of the DC/DC converter.

FIG. 13 is a circuit diagram showing a ninth embodiment of the DC/DC converter. The DC/DC converter 1 of this embodiment is based on the eighth embodiment (FIG. 12) and moreover characterized in that a computing unit 130 is used instead of the computing unit 120. Therefore, the same component elements as in the eighth embodiment are designated by the same reference signs as in FIG. 12 with their repetitive description omitted, and characterizing parts of the ninth embodiment will be described emphatically below.

The computing unit 130 performs a computing process of a second voltage RAMP and a current sense voltage CSNS (e.g., adding process of adding up the second voltage RAMP and the current sense voltage CSNS) to generate a third voltage RAMP' (=RAMP+CSNS).

Due to the above change, the PWM comparator 60 compares the first voltage VC inputted to the noninverting input terminal (+) and the third voltage RAMP' inputted to the inverting input terminal (−) to each other to generate a comparison signal CMP.

Even in such a case where the current mode control method is implemented by using the computing unit 130, setting the phase compensation circuit 40 equivalent in circuit construction to that of FIG. 7 makes possible to enjoy the same effects as in the foregoing fourth embodiment (FIG. 7). Also, the phase compensation circuit 40 may be set equivalent in circuit construction to that of FIG. 9.

<Tenth Embodiment>

Figure 14:
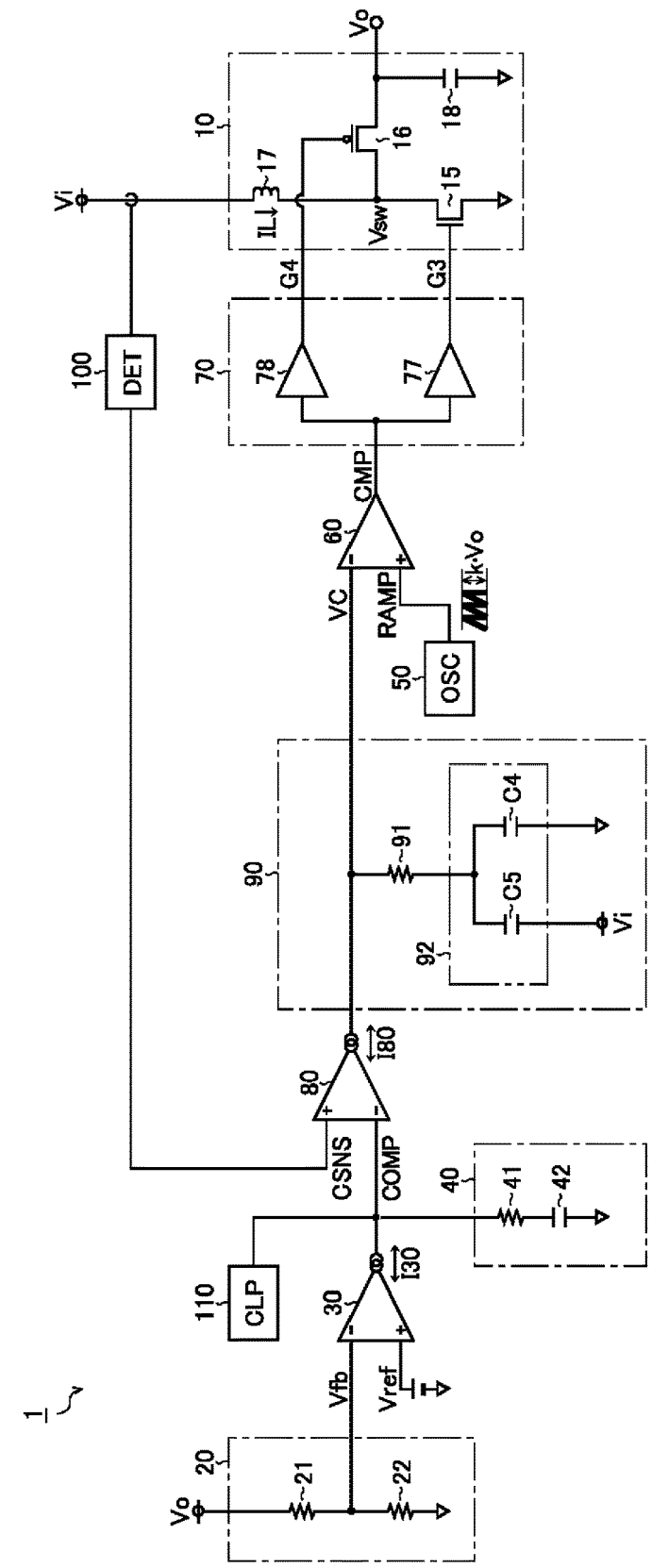
FIG. 14 is a circuit diagram showing a tenth embodiment of the DC/DC converter.

FIG. 14 is a circuit diagram showing a tenth embodiment of the DC/DC converter. The DC/DC converter 1 of this embodiment is based on the fourth embodiment (FIG. 7) and moreover characterized in that the switch output stage 10 is changed from the step-down type to the step-up type. Therefore, the same component elements as in the fourth embodiment are designated by the same reference signs as in FIG. 7 with their repetitive description omitted, and characterizing parts of the tenth embodiment will be described emphatically below.

The switch output stage 10 is a step-up type one which steps up an input voltage Vi to generate a desired output voltage Vo. The switch output stage 10 includes an output transistor 15 (NMOSFET in this figure), a synchronous rectifier transistor 16 (PMOSFET in this figure), a coil 17, and a capacitor 18. Circuit construction and operation of the switch output stage 10 are the same as in the foregoing third embodiment (FIG. 5), and their repetitive description is omitted.

Due to the change of the switch output stage 10 from the step-down type to the step-up type, changes are made also on the oscillator 50, the PWM comparator 60, the driver 70, and the second phase compensation circuit 90, respectively. Changed points of the individual parts will be described below.

In the oscillator 50, the amplitude of the second voltage RAMP is changed from a variable value (=k×Vi) responsive to the input voltage Vi to a variable value (=k×Vo) responsive to the output voltage Vo.

The PWM comparator 60 is inverted in its input polarity relative to that of the fourth to ninth embodiments. That is, the first voltage VC is inputted to the inverting input terminal (−) of the PWM comparator 60 while the second voltage RAMP is inputted to the noninverting input terminal (+) of the PWM comparator 60. Accordingly, in terms of logical level, the comparison signal CMP goes low level with the first voltage VC higher than the second voltage RAMP, and goes high level with the first voltage VC lower than the second voltage RAMP, as is reverse to the fourth to ninth embodiments.

The driver 70 includes buffers 77 and 78 instead of the inverters 75 and 76. The buffers 77 and 78 generate gate signals G3 and G4, respectively, both identical in logical level to the comparison signal CMP. Therefore, with the comparison signal CMP at high level, the gate signals G3 and G4 both go high level, so that the output transistor 15 is turned on while the synchronous rectifier transistor 16 turned off. Conversely, with the comparison signal CMP at low level, the gate signals G3 and G4 both go low level, so that the output transistor 15 is turned off while the synchronous rectifier transistor 16 is turned on.

Also, in the second phase compensation circuit 90, the monitoring-target voltage applied to the second terminal of the capacitor C5 is changed from the output voltage Vo to the input voltage Vi.

With the DC/DC converter 1 of this embodiment adopted, duty follow-up control responsive to transient fluctuations of the input voltage Vi can be realized by using the second phase compensation circuit 90. Thus, even with the switch output stage 10 provided as the step-up type, it becomes implementable to enjoy the rush-current suppression effect.

Also with the DC/DC converter 1 of this embodiment adopted, the amplitude of the second voltage RAMP fluctuates depending on the output voltage Vo. Therefore, even in event of an abrupt change in the output voltage Vo, the on-duty Don of the DC/DC converter 1 can be adjusted up to a proper value, making it achievable to suppress rush currents.

<Other Modifications>

Various technical features disclosed herein, without being limited to the above-described embodiments, may be modified in various ways unless those modifications depart from the gist of the technical contrivance of the disclosure. For example, mutual replacement between bipolar transistor and MOSFET transistor, and logical level inversion of various signals, are at arbitrary discretion. That is, the foregoing embodiments should be construed as not being limitative but being an exemplification at all points. Also, it should be construed that the technical scope of the present invention is defined not by the above description of the embodiments but by the appended claims, including all changes and modifications equivalent is sense and range to the claims.

INDUSTRIAL APPLICABILITY

The DC/DC converters disclosed herein are applicable as a power supply means for various applications.

What is claimed is:

1. A phase compensation circuit for compensating phase of a first voltage inputted to a PWM comparator of a DC/DC converter having a sleep mode, the phase compensation circuit comprising:
   a phase compensation resistor part including a resistor;
   a phase compensation capacitor part including a plurality of capacitors; and
   a switch group arranged to place the capacitors, in the sleep mode, into a first connection state in which at least one of the capacitors is charged with a first bias voltage and to place the capacitors, at cancellation of the sleep mode, into a second connection state in which the first voltage is set to a desired initial value, wherein
   the switch group changes a connection destination of at least one of the plurality of capacitors in response to a sleep control signal,
   the phase compensation capacitor part includes a first capacitor and a second capacitor each having a first terminal connected to a ground terminal, and
   the switch group includes a first switch arranged to make connecting and/or disconnecting between a second terminal of the first capacitor and the ground terminal, and a second switch arranged to change whether a second terminal of the second capacitor is connected to an application terminal of the first bias voltage or to the second terminal of the first capacitor.

2. The phase compensation circuit according to claim 1, wherein
   given a capacitance value C1 of the first capacitor and a capacitance value C2 of the second capacitor, then it is satisfied that C2/C1=k/(1−k) (where 0<k<1), and amplitude of a second voltage to be compared with the first voltage by the PWM comparator is set to k times that of an input voltage or an output voltage of the DC/DC converter.

3. The phase compensation circuit according to claim 1, wherein
   the phase compensation capacitor part further includes a third capacitor having a first terminal connected to the ground terminal, and
   the switch group further includes a third switch arranged to change whether a second terminal of the third capacitor is connected to an application terminal of a second bias voltage different from the first bias voltage or to the second terminal of the first capacitor.

4. The phase compensation circuit according to claim 3, wherein
   given a capacitance value C1 of the first capacitor, a capacitance value C2 of the second capacitor, and a capacitance value C3 of the third capacitor, then it is satisfied that C1:C2:C3={1−(k+k')}:k:k' (where 0<k<1 and 0<k'<1), and amplitude of a second voltage to be compared with the first voltage by the PWM comparator is set to k times that of an input voltage or an output voltage of the DC/DC converter.

5. The phase compensation circuit according to claim 1, wherein
the resistor has a first terminal connected to an input terminal of the PWM comparator as well as a second terminal connected to the second terminal of the first capacitor.

6. The phase compensation circuit according to claim 5, further comprising:
a switch arranged to make connecting and/or disconnecting between the input terminal of the PWM comparator and a stage circuit preceding the PWM comparator in response to the sleep control signal.

7. A DC/DC converter comprising:
a switch output stage arranged to generate an output voltage from an input voltage;
an amplifier arranged to generate an error signal responsive to a differential between the output voltage or a feedback voltage responsive thereto and a specified reference voltage;
a phase compensation circuit arranged to generate a first voltage upon receiving input of the error signal;
an oscillator arranged to generate a second voltage of a ramp waveform;
a PWM comparator arranged to compare the first voltage and the second voltage to each other to generate a comparison signal; and
a driver arranged to generate a drive signal for the switch output stage in response to the comparison signal, wherein
the phase compensation circuit comprises:
a phase compensation resistor part including a resistor;
a phase compensation capacitor part including a plurality of capacitors; and
a switch group arranged to place the capacitors, in a sleep mode of the DC/DC converter, into a first connection state in which at least one of the capacitors is charged with a first bias voltage and to place the capacitors, at cancellation of the sleep mode, into a second connection state in which the first voltage is set to a desired initial value, wherein
the switch group changes a connection destination of at least one of the plurality of capacitors in response to a sleep control signal,
the phase compensation capacitor part includes a first capacitor and a second capacitor each having a first terminal connected to a ground terminal, and
the switch group includes a first switch arranged to make connecting and/or disconnecting between a second terminal of the first capacitor and the ground terminal, and a second switch arranged to change whether a second terminal of the second capacitor is connected to an application terminal of the first bias voltage or to the second terminal of the first capacitor.

8. The DC/DC converter according to claim 7, wherein:
the switch output stage is a step-down type one, the first bias voltage is the output voltage, and amplitude of the second voltage is a variable value responsive to the input voltage; or
the switch output stage is a step-up type one, the first bias voltage is the input voltage, and amplitude of the second voltage is a variable value responsive to the output voltage.

9. A phase compensation circuit for compensating phase of a first voltage inputted to a PWM comparator of a DC/DC converter adopting a current mode control method, the phase compensation circuit comprising:

a phase compensation resistor part and a phase compensation capacitor part, wherein
one of the phase compensation resistor part and the phase compensation capacitor part includes a plurality of resistors or a plurality of capacitors, and
an output voltage or an input voltage of the DC/DC converter is applied as a monitoring-target voltage to a grounding-side node of at least one of the plurality of resistors or the plurality of capacitors, wherein
the phase compensation capacitor part includes a first capacitor having a first terminal connected to a ground terminal as well as a second capacitor having a first terminal connected to an application terminal of the monitoring-target voltage, and the phase compensation resistor part includes a resistor having a first terminal connected to an input terminal of the PWM comparator as well as a second terminal connected to respective second terminals of the individual capacitors.

10. The phase compensation circuit according to claim 9, wherein
given a capacitance value C1 of the first capacitor and a capacitance value C2 of the second capacitor, then it is satisfied that C2/C1=k/(1−k) (where 0<k<1), and amplitude of a second voltage to be compared with the first voltage by PWM comparator is set to k times that of the input voltage or the output voltage.

11. The phase compensation circuit according to claim 9, further comprising switch means arranged to change a connection state of the individual capacitors in response to a sleep control signal, the switch means including:
a first switch arranged to make connection and/or disconnection between a second terminal of the first capacitor and the ground terminal, and a second switch arranged to change whether a first terminal of the second capacitor is connected to an application terminal of the monitoring-target voltage or to the ground terminal.

12. The phase compensation circuit according to claim 11, further comprising
a switch arranged to make connection and/or disconnection between the input terminal of the PWM comparator and a stage circuit preceding the PWM comparator in response to the sleep control signal.

13. A phase compensation circuit for compensating phase of a first voltage inputted to a PWM comparator of a DC/DC converter adopting a current mode control method, the phase compensation circuit comprising:
a phase compensation resistor part and a phase compensation capacitor part, wherein
one of the phase compensation resistor part and the phase compensation capacitor part includes a plurality of resistors or a plurality of capacitors, and
an output voltage or an input voltage of the DC/DC converter is applied as a monitoring-target voltage to a grounding-side node of at least one of the plurality of resistors or the plurality of capacitors, wherein
the phase compensation resistor part includes a first resistor having a first terminal connected to a ground terminal as well as a second resistor having a first terminal connected to an application terminal of the monitoring-target voltage, and the phase compensation capacitor part includes a capacitor having a first terminal connected to an input terminal of the PWM comparator as well as a second terminal connected to respective second terminals of the individual resistors.

14. The phase compensation circuit according to claim 13, wherein
given a resistance value R1 of the first resistor and a resistance value R2 of the second resistor, then it is satisfied that R1/R2=k/(1−k) (where 0<k<1), and amplitude of a second voltage to be compared with the first voltage by the PWM comparator is set to k times that of the input voltage or the output voltage.

15. The phase compensation circuit according to claim 13, further comprising switch means arranged to change over connection state of the individual resistors in response to a sleep control signal, the switch means including:
a first switch arranged to make connection and/or disconnection between a second terminal of the first resistor and the ground terminal;
a second switch arranged to make connection and/or disconnection between the first terminal of the second resistor and the application terminal of the monitoring-target voltage, and
a third switch arranged to make connection and/or disconnection between the first terminal of the capacitor and the ground terminal.

16. A DC/DC converter comprising:
a switch output stage arranged to generate an output voltage from an input voltage;
a first amplifier arranged to generate a first error signal responsive to a differential between the output voltage or a feedback voltage responsive thereto and a specified reference voltage;
a first phase compensation circuit arranged to generate an error voltage upon receiving input of the first error signal;
a clamper arranged to restrict the error voltage to under a specified upper-limit voltage value;
a current detector arranged to generate a current sense voltage responsive to a coil current of the switch output stage;
a second amplifier arranged to generate a second error signal responsive to a differential between the error voltage and the current sense voltage;
a second phase compensation circuit arranged to output a first voltage upon receiving input of the second error signal;
an oscillator arranged to generate a second voltage of a ramp waveform;
a PWM comparator arranged to compare the first voltage and the second voltage to each other to generate a comparison signal; and
a driver arranged to generate a drive signal for the switch output stage in response to the comparison signal, wherein
the second phase compensation circuit comprises a phase compensation resistor part and a phase compensation capacitor part, wherein
one of the phase compensation resistor part and the phase compensation capacitor part includes a plurality of resistors or a plurality of capacitors, and
the output voltage or the input voltage of the DC/DC converter is applied as a monitoring-target voltage to a grounding-side node of at least one of the plurality of resistors or the plurality of capacitors, wherein
the phase compensation capacitor part includes a first capacitor having a first terminal connected to a ground terminal as well as a second capacitor having a first terminal connected to an application terminal of the monitoring-target voltage, and the phase compensation resistor part includes a resistor having a first terminal connected to an input terminal of the PWM comparator as well as a second terminal connected to respective second terminals of the individual capacitors.

17. The DC/DC converter according to claim 16, wherein:
the switch output stage is a step-down type one, the monitoring-target voltage is the output voltage, and amplitude of the second voltage is a variable value responsive to the input voltage; or
the switch output stage is a step-up type one, the monitoring-target voltage is the input voltage, and amplitude of the second voltage is a variable value responsive to the output voltage.

18. A DC/DC converter comprising:
a switch output stage arranged to generate an output voltage from an input voltage;
an amplifier arranged to generate an error signal responsive to a differential between the output voltage or a feedback voltage responsive thereto and a specified reference voltage;
a phase compensation circuit arranged to generate an error voltage upon receiving input of the error signal;
a clamper arranged to restrict the error voltage to under a specified upper-limit voltage value;
a current detector arranged to generate a current sense voltage responsive to a coil current of the switch output stage;
a computing unit arranged to generate a first voltage by computing process of the error voltage and the current sense voltage;
an oscillator arranged to generate a second voltage of a ramp waveform;
a PWM comparator arranged to compare the first voltage and the second voltage to each other to generate a comparison signal; and
a driver arranged to generate a drive signal for the switch output stage in response to the comparison signal, wherein
the phase compensation circuit comprises a phase compensation resistor part and a phase compensation capacitor part, wherein
one of the phase compensation resistor part and the phase compensation capacitor part includes a plurality of resistors or a plurality of capacitors, and
the output voltage or the input voltage of the DC/DC converter is applied as a monitoring-target voltage to a grounding-side node of at least one of the plurality of resistors or the plurality of capacitors, wherein
the phase compensation capacitor part includes a first capacitor having a first terminal connected to a ground terminal as well as a second capacitor having a first terminal connected to an application terminal of the monitoring-target voltage, and the phase compensation resistor part includes a resistor having a first terminal connected to an input terminal of the PWM comparator as well as a second terminal connected to respective second terminals of the individual capacitors.

19. A DC/DC converter comprising:
a switch output stage arranged to generate an output voltage from an input voltage;
an amplifier arranged to generate an error signal responsive to a differential between the output voltage or a feedback voltage responsive thereto and a specified reference voltage;
a phase compensation circuit arranged to generate a first voltage upon receiving input of the error signal;
a clamper arranged to restrict the first voltage to under a specified upper-limit voltage value;

a current detector arranged to generate a current sense voltage responsive to a coil current of the switch output stage;

an oscillator arranged to generate a second voltage of a ramp waveform;

a computing unit arranged to generate a third voltage by computing process of the second voltage and the current sense voltage;

a PWM comparator arranged to compare the first voltage and the third voltage to each other to generate a comparison signal; and a driver arranged to generate a drive signal for the switch output stage in response to the comparison signal, wherein the phase compensation circuit comprises a phase compensation resistor part and a phase compensation capacitor part, wherein one of the phase compensation resistor part and the phase compensation capacitor part includes a plurality of resistors or a plurality of capacitors, and the output voltage or the input voltage of the DC/DC converter is applied as a monitoring-target voltage to a grounding-side node of at least one of the plurality of resistors or the plurality of capacitors, wherein the phase compensation capacitor part includes a first capacitor having a first terminal connected to a ground terminal as well as a second capacitor having a first terminal connected to an application terminal of the monitoring-target voltage, and the phase compensation resistor part includes a resistor having a first terminal connected to an input terminal of the PWM comparator as well as a second terminal connected to respective second terminals of the individual capacitors.

20. A DC/DC converter comprising:

a switch output stage arranged to generate an output voltage from an input voltage;

a first amplifier arranged to generate a first error signal responsive to a differential between the output voltage or a feedback voltage responsive thereto and a specified reference voltage;

a first phase compensation circuit arranged to generate an error voltage upon receiving input of the first error signal;

a clamper arranged to restrict the error voltage to under a specified upper-limit voltage value;

a current detector arranged to generate a current sense voltage responsive to a coil current of the switch output stage;

a second amplifier arranged to generate a second error signal responsive to a differential between the error voltage and the current sense voltage;

a second phase compensation circuit arranged to output a first voltage upon receiving input of the second error signal;

an oscillator arranged to generate a second voltage of a ramp waveform;

a PWM comparator arranged to compare the first voltage and the second voltage to each other to generate a comparison signal; and a driver arranged to generate a drive signal for the switch output stage in response to the comparison signal, wherein the second phase compensation circuit comprises a phase compensation resistor part and a phase compensation capacitor part, wherein one of the phase compensation resistor part and the phase compensation capacitor part includes a plurality of resistors or a plurality of capacitors, and the output voltage or the input voltage of the DC/DC converter is applied as a monitoring-target voltage to a grounding-side node of at least one of the plurality of resistors or the plurality of capacitors, wherein the phase compensation resistor part includes a first resistor having a first terminal connected to a ground terminal as well as a second resistor having a first terminal connected to an application terminal of the monitoring-target voltage, and the phase compensation capacitor part includes a capacitor having a first terminal connected to an input terminal of the PWM comparator as well as a second terminal connected to respective second terminals of the individual resistors.

21. The DC/DC converter according to claim 20, wherein:

the switch output stage is a step-down type one, the monitoring-target voltage is the output voltage, and amplitude of the second voltage is a variable value responsive to the input voltage; or the switch output stage is a step-up type one, the monitoring-target voltage is the input voltage, and amplitude of the second voltage is a variable value responsive to the output voltage.

22. A DC/DC converter comprising:

a switch output stage arranged to generate an output voltage from an input voltage;

an amplifier arranged to generate an error signal responsive to a differential between the output voltage or a feedback voltage responsive thereto and a specified reference voltage;

a phase compensation circuit arranged to generate an error voltage upon receiving input of the error signal;

a clamper arranged to restrict the error voltage to under a specified upper-limit voltage value;

a current detector arranged to generate a current sense voltage responsive to a coil current of the switch output stage;

a computing unit arranged to generate a first voltage by computing process of the error voltage and the current sense voltage;

an oscillator arranged to generate a second voltage of a ramp waveform;

a PWM comparator arranged to compare the first voltage and the second voltage to each other to generate a comparison signal; and a driver arranged to generate a drive signal for the switch output stage in response to the comparison signal, wherein the phase compensation circuit comprises a phase compensation resistor part and a phase compensation capacitor part, wherein one of the phase compensation resistor part and the phase compensation capacitor part includes a plurality of resistors or a plurality of capacitors, and the output voltage or the input voltage of the DC/DC converter is applied as a monitoring-target voltage to a grounding-side node of at least one of the plurality of resistors or the plurality of capacitors, wherein the phase compensation resistor part includes a first resistor having a first terminal connected to a ground terminal as well as a second resistor having a first terminal connected to an application terminal of the monitoring-target voltage, and the phase compensation capacitor part includes a capacitor having a first terminal connected to an input terminal of the PWM comparator as well as a second terminal connected to respective second terminals of the individual resistors.

23. A DC/DC converter comprising:

a switch output stage arranged to generate an output voltage from an input voltage;

an amplifier arranged to generate an error signal responsive to a differential between the output voltage or a feedback voltage responsive thereto and a specified reference voltage;

a phase compensation circuit arranged to generate a first voltage upon receiving input of the error signal;

a clamper arranged to restrict the first voltage to under a specified upper-limit voltage value;

a current detector arranged to generate a current sense voltage responsive to a coil current of the switch output stage;

an oscillator arranged to generate a second voltage of a ramp waveform;

a computing unit arranged to generate a third voltage by computing process of the second voltage and the current sense voltage;

a PWM comparator arranged to compare the first voltage and the third voltage to each other to generate a comparison signal; and a driver arranged to generate a drive signal for the switch output stage in response to the comparison signal, wherein the phase compensation circuit comprises a phase compensation resistor part and a phase compensation capacitor part, wherein one of the phase compensation resistor part and the phase compensation capacitor part includes a plurality of resistors or a plurality of capacitors, and the output voltage or the input voltage of the DC/DC converter is applied as a monitoring-target voltage to a grounding-side node of at least one of the plurality of resistors or the plurality of capacitors, wherein the phase compensation resistor part includes a first resistor having a first terminal connected to a ground terminal as well as a second resistor having a first terminal connected to an application terminal of the monitoring-target voltage, and the phase compensation capacitor part includes a capacitor having a first terminal connected to an input terminal of the PWM comparator as well as a second terminal connected to respective second terminals of the individual resistors.

* * * * *